(12) United States Patent
Gomi et al.

(10) Patent No.: US 10,236,890 B2
(45) Date of Patent: Mar. 19, 2019

(54) SEMICONDUCTOR DEVICE AND METHOD FOR CONTROLLING THE SAME

(71) Applicant: Renesas Electronics Corporation, Tokyo (JP)

(72) Inventors: Takahiko Gomi, Tokyo (JP); Tetsuya Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/376,311

(22) Filed: Dec. 12, 2016

(65) Prior Publication Data

US 2017/0093406 A1  Mar. 30, 2017

Related U.S. Application Data

(63) Continuation of application No. 14/651,696, filed as application No. PCT/JP2012/008187 on Dec. 21, 2012, now Pat. No. 9,531,388.

(51) Int. Cl.
| | |
|---|---|
| *H03K 21/00* | (2006.01) |
| *H03K 23/00* | (2006.01) |
| *H03K 25/00* | (2006.01) |
| *H03L 1/02* | (2006.01) |
| *G06F 1/20* | (2006.01) |
| *G06F 1/324* | (2019.01) |
| *G06F 1/28* | (2006.01) |

(52) U.S. Cl.
CPC .............. *H03L 1/027* (2013.01); *G06F 1/206* (2013.01); *G06F 1/28* (2013.01); *G06F 1/324* (2013.01); *Y02D 10/126* (2018.01)

(58) Field of Classification Search
CPC ......... H03L 1/027; G06F 1/206; G06F 1/324; Y02B 60/1217
USPC ........................... 327/530–546; 323/312–317
See application file for complete search history.

(56) References Cited

U.S. PATENT DOCUMENTS

| 6,055,489 A | 4/2000 | Beatty |
| 7,216,064 B1 | 5/2007 | Pippin |
| 7,714,635 B2 | 5/2010 | Singh |

(Continued)

FOREIGN PATENT DOCUMENTS

| JP | H 07-160367 A | 6/1995 |
| JP | 2009-187523 A | 7/2000 |

(Continued)

OTHER PUBLICATIONS

Chinese Office Action dated Feb. 28, 2017, with an English translation.

(Continued)

*Primary Examiner* — Brandon S Cole
(74) *Attorney, Agent, or Firm* — McGinn IP Law Group, PLLC

(57) ABSTRACT

A semiconductor device includes a mode determination unit configured to determine a power mode based on a temperature of the semiconductor device and a reference temperature, the power mode including one of a first mode which sets the operating frequency of the operation clock to be a first operating frequency and a second mode which sets the operating frequency of the operation clock to be a second operating frequency, and output a control signal according to the power mode to a clock generating unit.

20 Claims, 24 Drawing Sheets

(56) References Cited

U.S. PATENT DOCUMENTS

| | | |
|---|---|---|
| 2007/0250219 A1 | 10/2007 | Gaskins |
| 2009/0295458 A1 | 12/2009 | Kameyama |
| 2010/0017636 A1 | 1/2010 | Hashimoto et al. |
| 2010/0244942 A1 | 9/2010 | Okano |
| 2010/0321037 A1 | 12/2010 | Sutardja |
| 2011/0009083 A1 | 1/2011 | Namba |
| 2012/0053897 A1 | 3/2012 | Naffziger |
| 2013/0135782 A1 | 5/2013 | Roth |
| 2013/0188429 A1 | 7/2013 | Huang |
| 2013/0321041 A1 | 12/2013 | Kim |
| 2015/0341038 A1* | 11/2015 | Pancholi .................. H03L 1/04 331/34 |

FOREIGN PATENT DOCUMENTS

| | | |
|---|---|---|
| JP | 2004-280378 A | 10/2004 |
| JP | 2007-165527 A | 6/2007 |
| JP | 2008-146189 A | 6/2008 |
| JP | 2009-230670 A | 10/2009 |
| JP | 2011-252771 A | 12/2011 |
| JP | 2012-251944 A | 12/2012 |
| WO | WO 2009/078081 A1 | 6/2009 |

OTHER PUBLICATIONS

Japanese Office Action dated Sep. 12, 2017, with an English translation thereof.
Japanese Office Action dated Jun. 13, 2017, with an English translation.
International Search Report (ISR) (PCT Form PCT/ISA/210) in PCT/JP2012/008187, dated Feb. 5, 2013.
Japanese Office Action dated Oct. 20, 2015, with a partial English translation thereof.
Japanese Office Action dated Feb. 7, 2017, with a partial English translation.

* cited by examiner

| | OPERATING FREQUENCY | TEMPERATURE |
|---|---|---|
| LEAKAGE POWER $P_L$ | NOT DEPEND | DEPEND |
| IDLE POWER $P_I$ | DEPEND | NOT DEPEND |
| ACTIVE POWER $P_A$ | NOT DEPEND | NOT DEPEND |

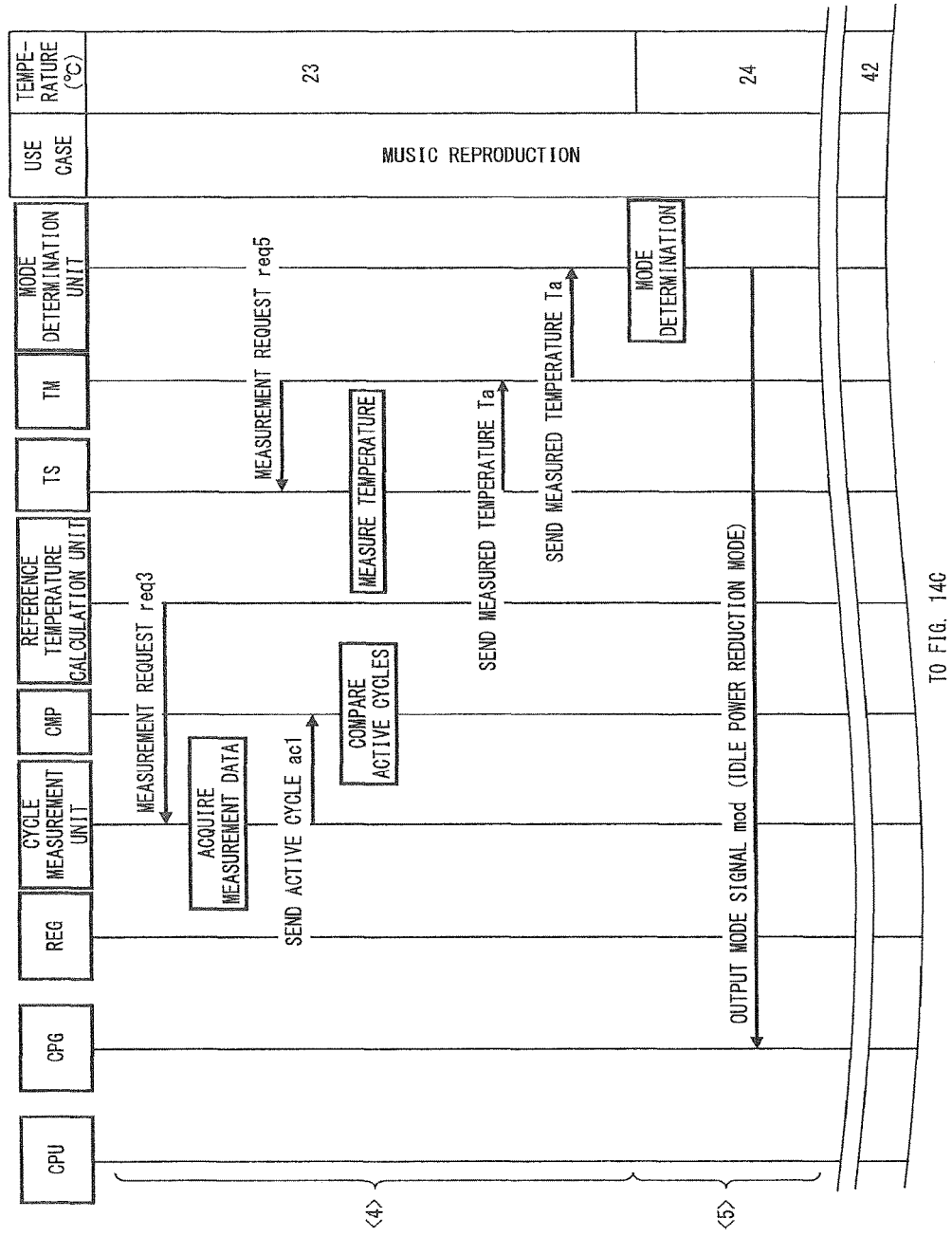

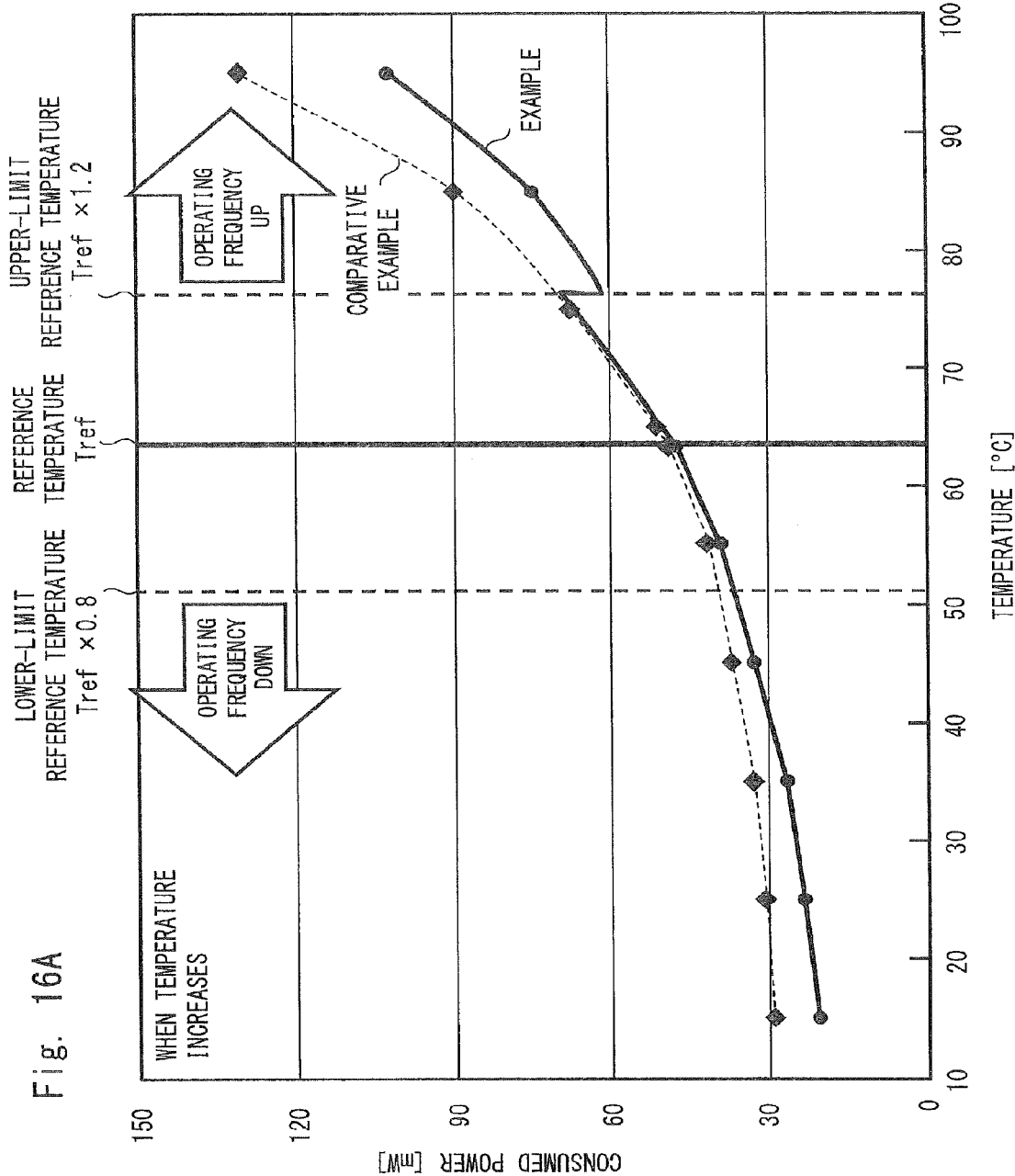

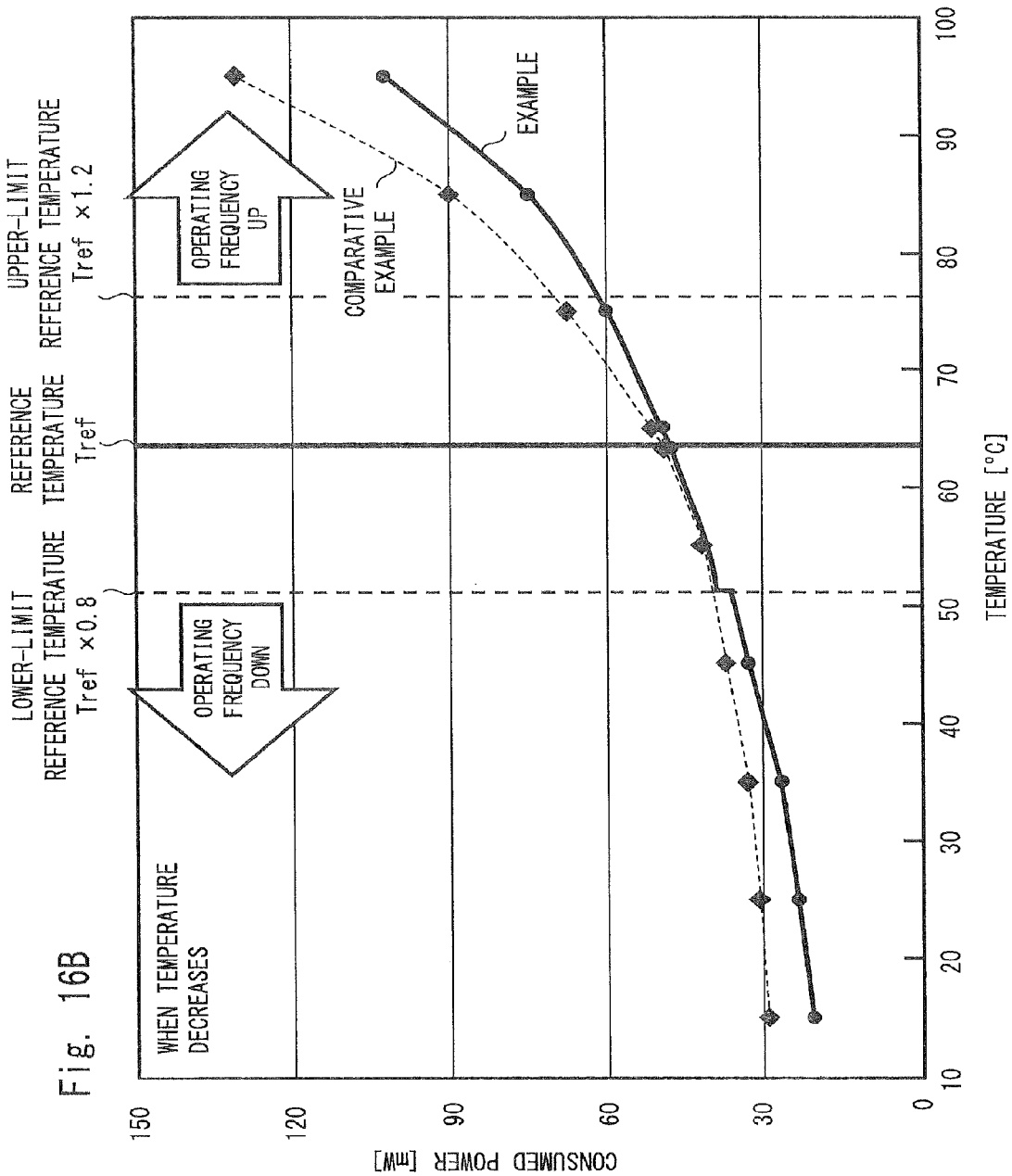

SEMICONDUCTOR DEVICE AND METHOD FOR CONTROLLING THE SAME

CROSS-REFERENCE TO RELATED APPLICATIONS

This application is based upon and claims the benefit of priority from U.S. patent application Ser. No. 14/651,696, filed on Jun. 12, 2015, which is based on International Publication No. PCT/JP2012/008187 filed on Dec. 21, 2012, which is incorporated herein in its entirety by reference.

TECHNICAL FIELD

The present invention relates to a semiconductor device and a method for controlling the same.

BACKGROUND ART

In recent years, the functions and the performance of semiconductor devices have been improving in accordance with miniaturization thereof, but as a result, the proportion of a leakage power (power consumed by a leakage current) in the consumed power tends to increase. It is known that the leakage power abruptly changes according to a temperature.

Incidentally, Patent literature 1 to 3 each disclose a technique for controlling an operating frequency (frequency of an operation clock) according to a temperature of a Central Processing Unit (CPU) or a processor.

CITATION LIST

Patent Literature

[Patent Literature 1] Japanese Unexamined Patent Application Publication No. 2000-187523
[Patent Literature 2] Japanese Unexamined Patent Application Publication No. 2009-230670
[Patent Literature 3] Japanese Unexamined Patent Application Publication No. 7-160367

SUMMARY OF INVENTION

Technical Problem

The inventors have found various problems when developing semiconductor devices used for communication terminals and the like. Each of the embodiments disclosed in the present application provides a semiconductor device suitable, for example, for communication terminals and the like.

Other problems and novel characteristics will be apparent from the description of the present specification and the accompanying drawings.

Solution to Problem

In a semiconductor device according to one embodiment, when a measured temperature is higher than a predetermined reference temperature, an operating frequency is switched from a first frequency to a second frequency higher than the first frequency.

Advantageous Effects of Invention

According to one embodiment, it is possible to provide a semiconductor device having a high quality that is suitable, for example, for an electronic device such as a wireless communication terminal.

BRIEF DESCRIPTION OF DRAWINGS

FIG. 3 is a table showing dependencies for the operating frequency and the temperature for each of a leakage power $P_L$, an idle power $P_I$, and an active power $P_A$;
FIG. 14B is a sequence diagram for describing details of the power reduction mode control method according to the actual use case (music reproduction and video reproduction);

FIG. 16A is a graph for describing temperature dependencies of a consumed power when the temperature of a semiconductor device according to an example of the third embodiment increases; and FIG. 16B is a graph for describing temperature dependencies of a consumed power when the temperature of the semiconductor device according to the example of the third embodiment decreases.

DESCRIPTION OF EMBODIMENTS

Hereinafter, with reference to the drawings, specific exemplary embodiments will be described in detail. It should be noted, however, that the present invention is not limited to the following embodiments. The following descriptions and the drawings are simplified as appropriate for the sake of clarification of description.

<Matters Examined in Advance>
<Cause of Leakage Power>

First, the matters that had been examined in advance by the present inventors will be described.

Figure 1:
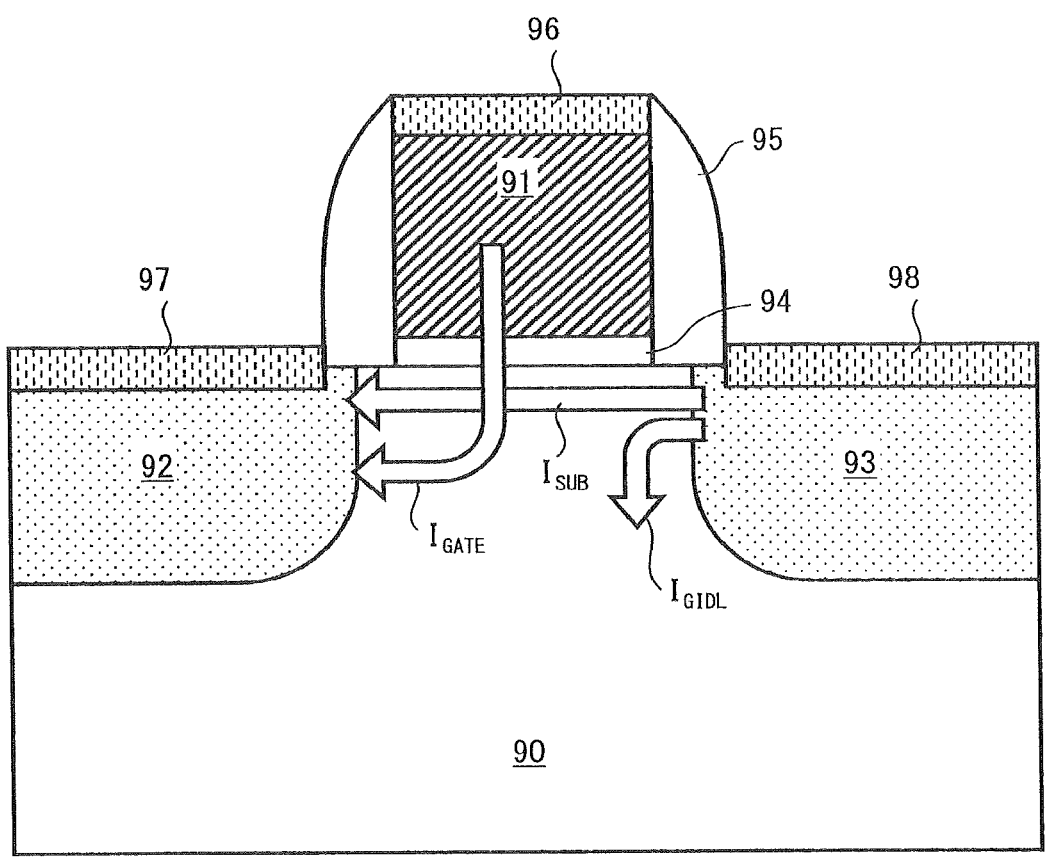
FIG. 1 is a cross-sectional view of a MOSFET for describing a leakage current.

As stated above, the increase in the leakage power in the consumed power, which occurs due to the miniaturization of semiconductor devices, is a problem. With reference to FIG. 1, a leakage current, which is a case of the leakage power, will be described. FIG. 1 is a cross-sectional view of a Metal-Oxide-Semiconductor Field-Effect Transistor (MOSFET) for describing the leakage current.

The MOSFET shown in FIG. 1 includes a silicon substrate 90, a gate 91, a source 92, a drain 93, and a gate insulating film 94. Further, this MOSFET includes side walls 95 formed on side surfaces of the gate 91, a gate contact 96 formed on the gate 91, a source contact 97 formed on the source 92, and a drain contact 98 formed on the drain 93.

As shown in FIG. 1, a main leakage current includes three types of current: a subthreshold leakage current $I_{SUB}$, a gate leakage current (gate tunnel current) $I_{GATE}$, and a Gate-Induced Drain Leakage (GIDL) current $I_{GIDL}$.

The subthreshold leakage current $I_{SUB}$ is a current that flows between the drain 93 and the source 92 when the MOSFET is OFF. The subthreshold leakage current $I_{SUB}$ tends to increase in accordance with a decrease in a threshold voltage in recent MOSFETs. The subthreshold leakage current $I_{SUB}$ has a large temperature dependency, and sharply increases in accordance with an increase in a junction temperature (channel temperature) of the MOSFET.

The gate leakage current (gate tunnel current) $I_{GATE}$ is a current that flows between the gate 91 and the silicon substrate 90 (or between the gate 91 and the source 92, or between the gate 91 and the drain 93) because of electrons tunneling through the thin gate insulating film 94.

The Gate-Induced Drain Leakage (GIDL) current $I_{GIDL}$, is a current that flows between the drain 93 and the silicon substrate 90 due to tunneling caused by an electric field between the gate 91 and the drain 92.

The gate leakage current $I_{GATE}$ and the GIDL current $I_{GIDL}$, increase due to a decrease in the thickness of the gate insulating film 94 according to the miniaturization of the MOSFET. On the other hand, the temperature dependencies of the gate leakage current $I_{GATE}$ and the GIDL current $I_{GIDL}$ are both small.

<Configuration of Consumed Power and Operating Frequency Dependencies and Temperature Dependencies of Consumed Power>

Figure 2A:
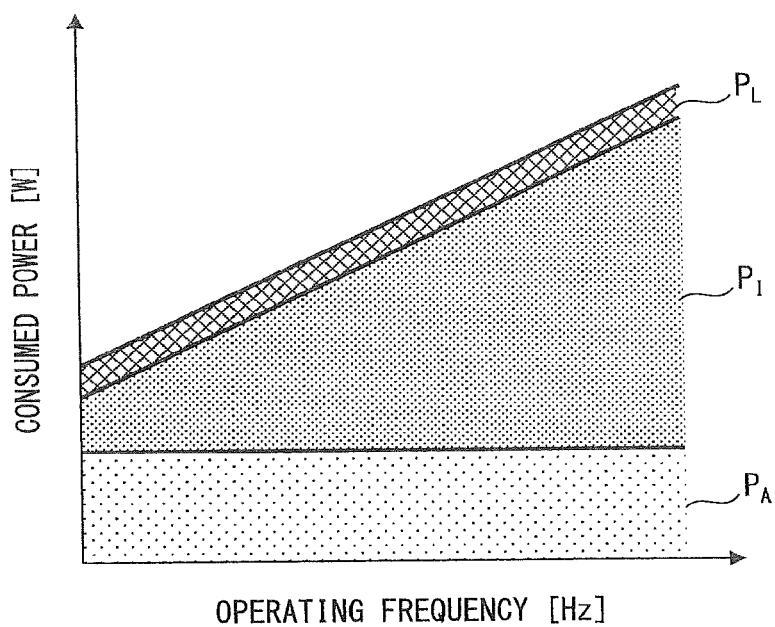
FIG. 2A is a graph showing operating frequency dependencies of a consumed power in a constant processing load.
Figure 2B:
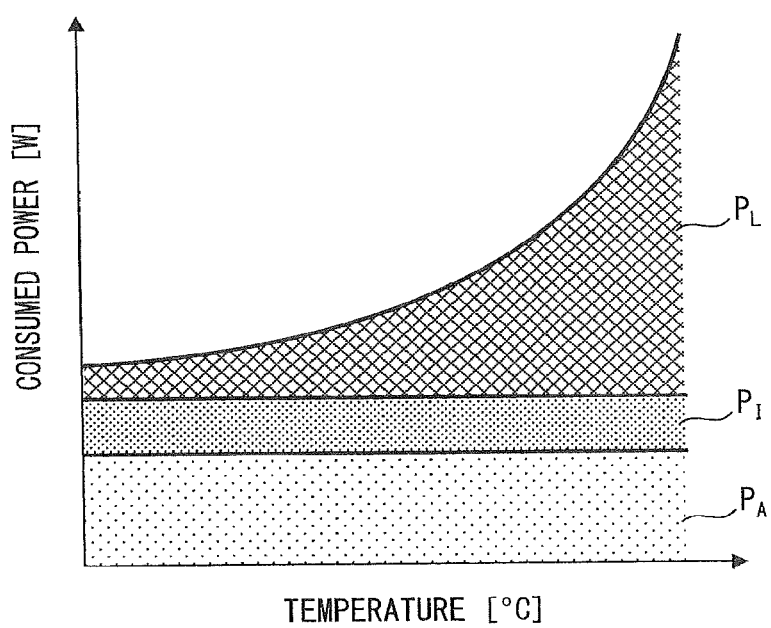
FIG. 2B is a graph showing temperature dependencies of the consumed power in the constant processing load.

Referring next to FIGS. 2A and 2B, operating frequency dependencies and temperature dependencies of the consumed power will be described. FIG. 2A is a graph showing the operating frequency dependencies of the consumed power in a constant processing load. FIG. 2B is a graph showing temperature dependencies of the consumed power in the constant processing load.

As shown in FIGS. 2A and 2B, the consumed power includes an active power $P_A$, an idle power $P_I$, and a leakage power $P_L$. The active power $P_A$ is a power that is consumed when the semiconductor device actually executes processing. Accordingly, when the processing load is constant, the active power $P_A$ is also constant. The idle power is a power consumed when the status (operation state) of the semiconductor device is in an idle state, and is always consumed as long as a power and a clock are supplied. The leakage power is a power consumed by the leakage current, and is always consumed as long as the power is supplied.

The statuses of the semiconductor device will now be described. The statuses of the semiconductor device include three states: an active state, an idle state, and a shutdown state.

The active state is a state in which a power and a clock are supplied and processing is actually being carried out. This state is a state in which, when the semiconductor device is an application processor for a wireless communication terminal, for example, the semiconductor device actually carries out processing such as a wireless data communication, a music reproduction, or a video reproduction. In the active state, the active power $P_A$, the idle power $P_I$, and the leakage power $P_L$ are all generated.

The idle state (also called a stalled state) is a state in which, while the power and the clock are supplied, the processing is not actually carried out (i.e., a state in which a response from a target is awaited). In the idle state, the idle power $P_I$ and the leakage power $P_L$ are generated and the active power $P_A$ is not generated.

The shutdown state is a state in which the power and the clock are not supplied. In the shutdown state, none of the active power $P_A$, the idle power $P_I$, and the leakage power $P_L$ occurs.

As shown in FIG. 2A, the active power $P_A$ and the leakage power $P_L$ are not operating frequency (operation clock frequency) dependent. The active power per unit time increases in accordance with the increase in the operating frequency. However, since the processing load is constant, the processing time increases. Accordingly, the active power $P_A$ required for the processing (=active power per unit time×processing time) becomes constant regardless of the operating frequency. On the other hand, the idle power $P_I$ increases in proportion to the operating frequency. Accordingly, the whole power consumption increases in accordance with the increase in the operating frequency.

As shown in FIG. 2B, the active power $P_A$ and the idle power $P_I$ are not temperature dependent. On the other hand, the leakage power $P_L$ sharply increases in accordance with the increase in the temperature. Accordingly, the whole power consumption sharply increases in accordance with the increase in the temperature.

FIG. 3 is a table showing dependencies for the operating frequency and the temperature for each of the leakage power $P_L$, the idle power $P_I$, and the active power $P_A$. As shown in FIG. 3, while the leakage power $P_L$ does not depend on the operating frequency, it depends on the temperature. Specifically, as shown in FIG. 2B, the leakage power $P_L$ increases in accordance with the increase in the temperature. While the idle power $P_I$ depends on the operating frequency, it does not depend on the temperature. Specifically, as shown in FIG. 2A, the idle power $P_I$ increases with the increase in the operating frequency. The active power $P_A$ neither depends on the operating frequency nor the temperature.

Comparative Example and Problem Therewith

Figure 4A:
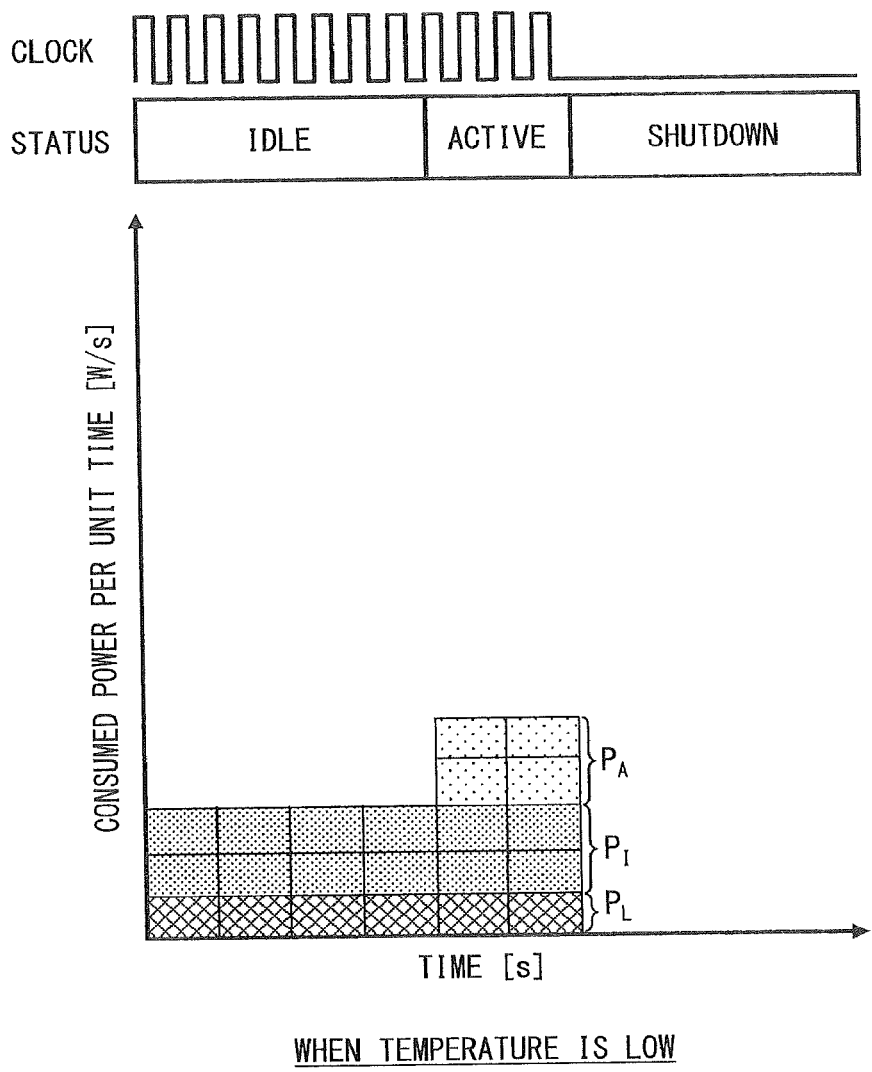
FIG. 4A is a graph schematically showing a configuration of a consumed power when the temperature of a semiconductor device according to a comparative example is low.
Figure 4B:
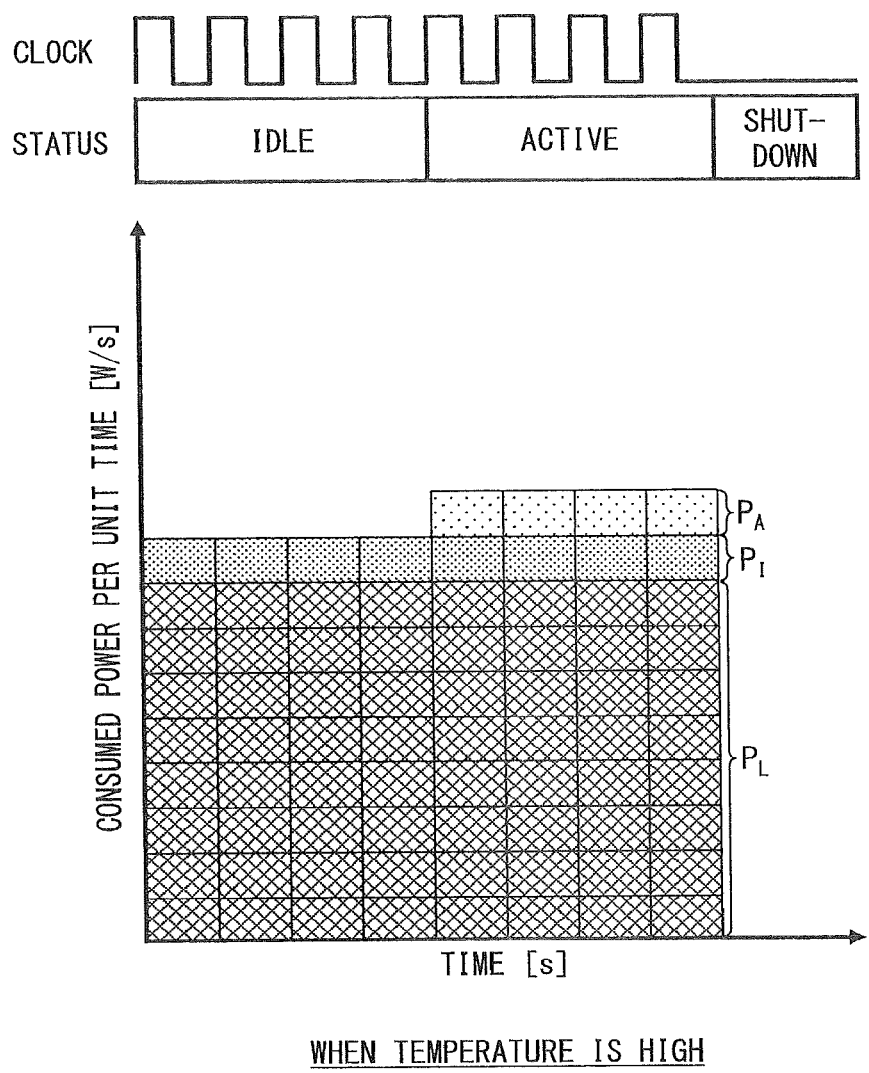
FIG. 4B is a graph schematically showing a configuration of a consumed power when the temperature of the semiconductor device according to the comparative example is high.

FIGS. 4A and 4B each show a comparative example studied by the present inventors. In this example, the power consumed in the semiconductor device in which the operating frequency is set to be high when the temperature of the semiconductor device is low and the operating frequency is set to be low when the temperature of the semiconductor device is high is studied. FIG. 4A is a graph schematically showing a configuration of the consumed power when the temperature of the semiconductor device according to the comparative example is low. FIG. 4B is a graph schematically showing a configuration of the consumed power when the temperature of the semiconductor device according to the comparative example is high. FIGS. 4A and 4B both show the configuration of the consumed power in the constant processing load.

In the graphs shown in FIGS. 4A and 4B, the horizontal axis indicates time [s] and the vertical axis indicates a consumed power per unit time [Ws]. The operation clock (CLOCK) and the status (STATUS) are shown according to the time in the horizontal axis. As shown in FIG. 4A, the idle power $P_I$ and the leakage power $P_L$ per unit time are constant regardless of whether the semiconductor device is in the idle state or in the active state. The active power $P_A$ is generated only when the semiconductor device is in the active state. Further, the consumed power is not generated when the semiconductor device is in the shutdown state. The same is true for FIG. 4B. The time integration value of the consumed power per unit time shown in each of FIGS. 4A and 4B (i.e., the area of the graph or the number of squares shown in each of FIGS. 4A and 4B) corresponds to the consumed power.

The operating frequency in FIG. 4B is half as large as that in FIG. 4A, and the idle power $P_I$ per unit time in FIG. 4B is half as large as that in FIG. 4A. On the other hand, the leakage power $P_L$ per unit time in FIG. 4B is eight times as large as that in FIG. 4A due to the increase in the temperature. Since the processing load in FIGS. 4A and 4B is constant, the total active power $P_A$ required for the processing in FIG. 4A is the same as that in FIG. 4B. However, since the operating frequency in FIG. 4B is half as large as that in FIG. 4A, time required for the processing in FIG. 4B is twice as long as that in FIG. 4A. As a result, there is a problem in the comparative example that the time during which the semiconductor device is in the shutdown state becomes short and the leakage power $P_L$ increases when the temperature is high.

The present inventors have studied about the reduction in the power consumed in the semiconductor device. The details thereof will be described below.

First Embodiment

<Overview of Wireless Communication Terminal>

First, with reference to FIGS. 5A and 5B, an explanation will be given of an overview of a wireless communication terminal suitable for use as an electronic device to which a semiconductor device according to this embodiment is applied. Each of FIGS. 5A and 5B is an exterior view showing an exemplary structure of a wireless communication terminal 500.

Figure 5A:
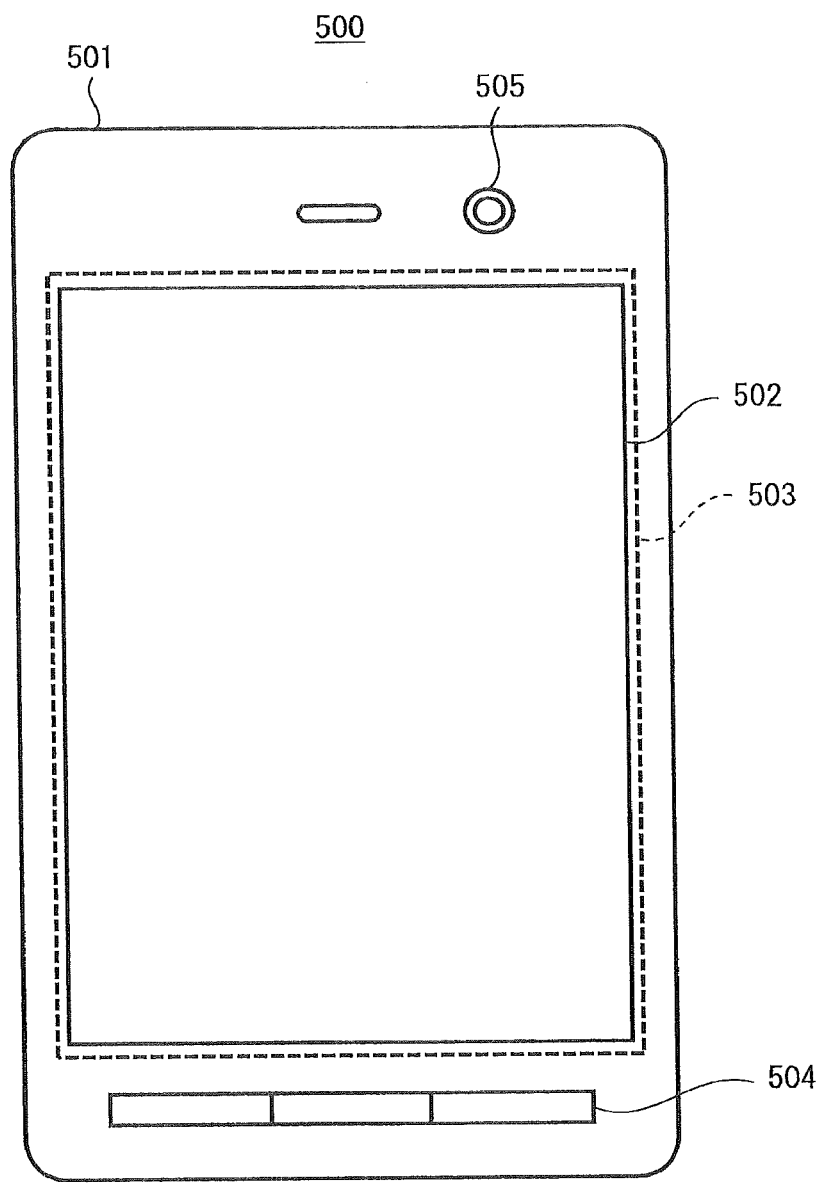
FIG. 5A is an exterior view showing an exemplary structure of a wireless communication terminal.
Figure 5B:
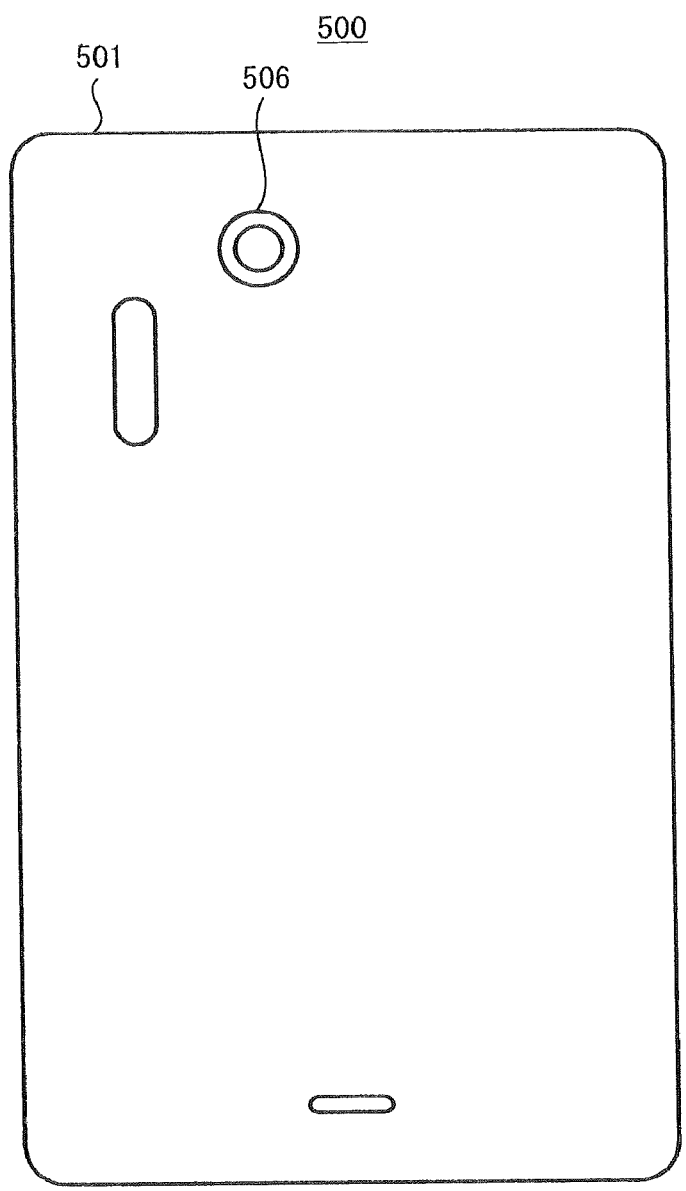
FIG. 5B is an exterior view showing an exemplary structure of the wireless communication terminal.

Note that FIGS. 5A and 5B each show the case where the wireless communication terminal 500 is a smartphone. However, the wireless communication terminal 500 may be another wireless communication terminal such as a feature phone (e.g., a flip mobile phone terminal), a portable game terminal, a tablet PC (Personal Computer), a notebook PC, and the like. Needless to say, the semiconductor device according to this embodiment is applicable to any device other than wireless communication terminals.

FIG. 5A shows one main surface (front face) of a housing 501 that forms the wireless communication terminal 500. On the front face of the housing 501, a display device 502, a touch panel 503, a plurality of operation buttons 504, and a camera device 505 are disposed. On the other hand, FIG. 5B shows the other main surface (back face) of the housing 501. On the back face of the housing 501, a camera device 506 is disposed.

The display device 502 is a display device such as a liquid crystal display (LCD: Liquid Crystal Display), an organic EL display (OLED: Organic Light-Emitting Diode) and the like. The display device 502 is disposed such that the displaying face is positioned on the front face of the housing 501.

The touch panel 503 is disposed so as to cover the displaying face of the display device 502. Alternatively, it is disposed on the back side of the display device 502. The touch panel 503 senses the position on the displaying face touched by a user. That is, the user can intuitively operate the wireless communication terminal 500 by touching the displaying face of the display device 502 with a finger, a dedicated pen (generally referred to as a stylus) and the like.

The operation buttons 504 are used for auxiliary operating of the wireless communication terminal 500. Note that such operation buttons may not be provided depending on the wireless communication terminals.

The camera device 505 is a sub-camera whose lens unit is positioned on the front face of the housing 501. Note that such a sub-camera may not be provided depending on the wireless communication terminals.

The camera device 506 is a main camera whose lens unit is positioned on the back face of the housing 501.

<Structure of Wireless Communication Device>

Figure 6:
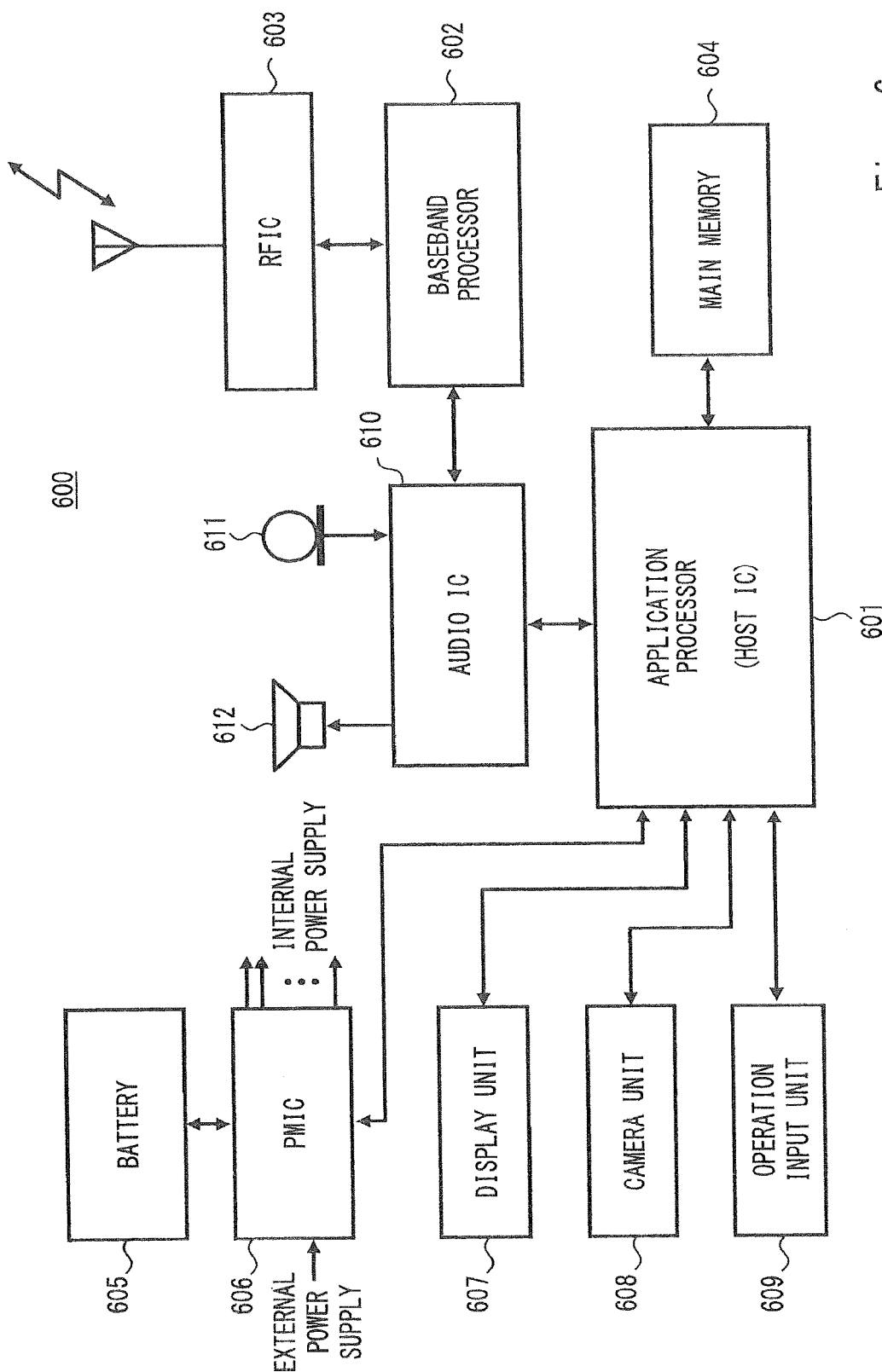
FIG. 6 is a block diagram showing an exemplary structure of a wireless communication device according to a first embodiment.

With reference to FIG. 6, an explanation will be given of the structure of a wireless communication device 600 in which the semiconductor device according to this embodiment is installed. FIG. 6 is a block diagram showing an exemplary structure of the wireless communication device 600 according to the first embodiment. The wireless communication device 600 is, for example, the internal structure of the wireless communication terminal 500 shown in the FIGS. 5A and 5B.

As shown in FIG. 6, the wireless communication device 600 includes an application processor (host IC) 601, a baseband processor 602, a Radio Frequency Integrated Circuit (RFIC) 603, a main memory 604, a battery 605, a power management IC (PMIC: Power Management Integrated Circuit) 606, a display unit 607, a camera unit 608, an operation input unit 609, an audio IC 610, a microphone 611, and a speaker 612.

The application processor (host IC) 601 is a semiconductor integrated circuit that reads programs stored in the main memory 604 to carry out processing for implementing various functions of the wireless communication device 600. For example, the application processor 601 reads an Operating System (OS) program from the main memory 604 and executes the same, and executes any application program that operates on the OS program.

The baseband processor 602 subjects data transmitted and received by the mobile communication terminal to baseband processing, which includes an encoding process (e.g., error correction coding of convolution codes, turbo codes and the like), a decoding process and the like. As to voice data, for example, the baseband processor 602 receives transmission voice data from the audio IC 610 and performs an encoding process on the received transmission voice data, and transmits the encoded transmission voice data to the RFIC 603. On the other hand, the baseband processor 602 receives reception voice data from the RFIC 603 and performs a decoding process on the received reception voice data, and transmits the decoded reception voice data to the audio IC 610.

The RFIC 603 performs analog RF signal processing. The analog RF signal processing includes frequency upconversion, frequency downconversion, amplification and the like. As to voice data, for example, the RFIC 603 generates a transmission RF signal from transmission voice data modulated by the baseband processor 602, and transmits the transmission RF signal via an antenna in a wireless manner. On the other hand, the RFIC 603 receives a reception RF signal via the antenna in a wireless manner and generates reception voice data from the reception RF signal, and transmits the generated reception voice data to the baseband processor 602.

The main memory (external memory) 604 stores programs and data that are used by the application processor 601. A volatile memory such as a Dynamic Random Access Memory (DRAM) is frequently used as the main memory 604. Data stored in the volatile memory is deleted when power supply is shut down. Needless to say, a non-volatile memory that retains stored data even when power supply is shut down may be used as the main memory 604.

The battery 605 is an electric battery, and used when the wireless communication device 600 operates independently of an external power supply. Note that the wireless communication device 600 may be supplied with power from the battery 605 even when it is connected to any external power supply. Further, it is preferable to use a secondary battery as the battery 605.

The power management IC 606 generates an internal power supply from the battery 605 or an external power supply. This internal power supply is supplied to each of the blocks in the wireless communication device 600. The power management IC 606 controls the voltage of the internal power supply for each block supplied with the internal power supply. The power management IC 606 performs the voltage control for the internal power supply based on instructions from the application processor 601. Further, the power management IC 606 can control supplying and blocking of the internal power supply for each block. In addition, the power management IC 606 also performs charging control for the battery 605 when supply from the external power supply is available.

The display unit 607 corresponds to the display device 502 shown in FIGS. 5A and 5B, and is a display device such as a liquid crystal display (LCD: Liquid Crystal Display), an organic EL display (OLED: Organic Light-Emitting Diode) and the like. The display unit 607 displays various images in accordance with processes performed by the application processor 601. The images displayed on the display unit 607 include user-interface images by which the user provides operation instructions to the wireless communication device 600, camera images, moving images and the like.

The camera unit 608 acquires an image in accordance with an instruction from the application processor 601. The camera unit 608 corresponds to the camera devices 505 and 506 in FIGS. 5A and 5B.

The operation input unit 609 is a user interface for the user to operate to provide an operation instruction to the wireless communication device 600. The operation input unit 609 corresponds to the touch panel 503 and the operation buttons 504 shown in FIGS. 5A and 5B.

The audio IC 610 converts reception voice data, which is a digital signal received from the baseband processor 602, into an analog signal, and drives the speaker 612. Thus voice is output from the speaker 612. On the other hand, the audio IC 610 subjects voice, which is an analog signal detected by the microphone 611, to an analog-to-digital (A/D) conversion, and outputs the converted signal to the baseband processor 602.

<Configuration of Semiconductor Device According to First Embodiment>

Figure 7:
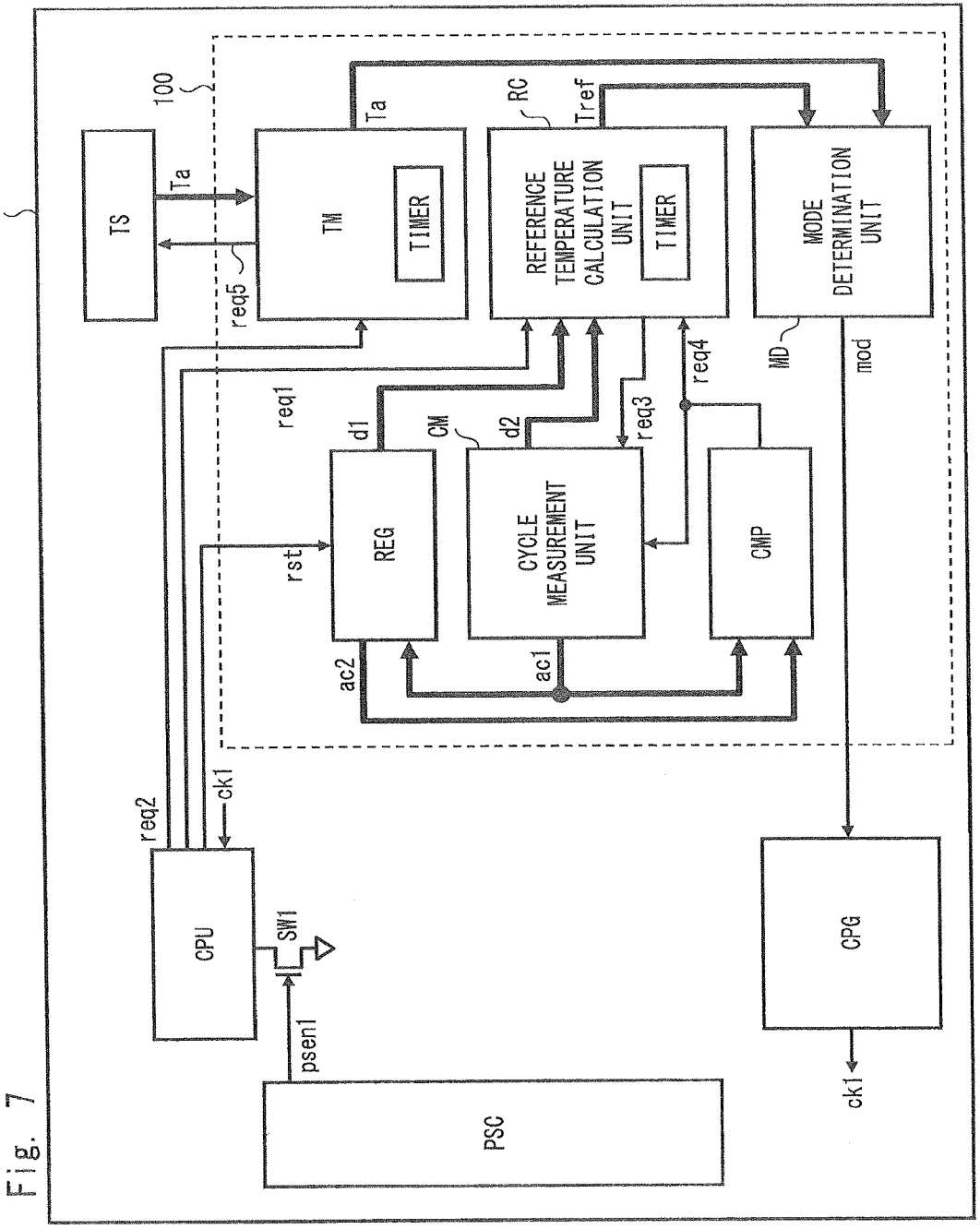
FIG. 7 is a block diagram showing an exemplary structure of an application processor 601 according to the first embodiment.

Referring to FIG. 7, the configuration of the application processor 601, which is the semiconductor device according to the first embodiment, will be described. FIG. 7 is a block diagram showing an exemplary structure of the application processor 601 according to the first embodiment. As shown in FIG. 7, the application processor 601 according to the first embodiment includes a CPU (operation unit), a temperature sensor TS, a power reduction mode controller (controller) 100, a clock generation unit CPG, and a power supply controller PSC. The power reduction mode controller 100 includes a temperature monitoring unit TM, a reference temperature calculation unit RC, a cycle measurement unit CM, a storage unit REG, a comparison unit CMP, and a mode determination unit MD. In FIG. 7, thick arrows indicate data and thin arrows indicate various control signals and clocks.

The application processor 601 according to the first embodiment is provided on one semiconductor chip. In the application processor 601, the power reduction mode controller 100 controls a power reduction mode according to a chip temperature (temperature of the semiconductor chip) measured by the temperature sensor TS. Specifically, when the chip temperature exceeds a predetermined reference temperature, the power reduction mode controller 100 selects a leakage power reduction mode (first mode) and sets a frequency of an operation clock of the CPU generated by the clock generation unit CPG to be high.

On the other hand, when the chip temperature of the application processor 601 is below the predetermined reference temperature, the power reduction mode controller 100 selects an idle power reduction mode (second mode) and sets the frequency of the operation clock of the CPU generated by the clock generation unit CPG to be low. In summary, the power reduction mode controller 100 controls the frequency of the operation clock generated by the clock generation unit CPG.

The CPU operates according to an operation clock ck1 output from the clock generation unit CPG. That is, the operating frequency of the CPU is a frequency of the operation clock ck1. When the system starts, the CPU outputs an initializing signal rst to the storage unit REG to initialize various data stored in the storage unit REG. The CPU then outputs to the reference temperature calculation unit RC a start request req1 to request the reference temperature calculation unit RC to start a subroutine 1 to calculate a reference temperature Tref. The details of the subroutine 1 will be described later. The CPU further outputs to the temperature monitoring unit TM a start request req2 to request the temperature monitoring unit TM to start a subroutine 2 to acquire a measured temperature Ta. The details of the subroutine 2 will be described later.

The temperature sensor TS is a so-called on-chip temperature sensor, and measures the chip temperature of the application processor 601 (may be referred to as a junction temperature or a channel temperature).

The temperature monitoring unit TM starts, in response to the start request req2 of the subroutine 2 output from the CPU, monitoring of the measured temperature Ta measured by the temperature sensor TS. The temperature monitoring unit TM includes a timer therein. The timer is, for example, a counter. The timer repeats, for example, counting from 0 to the maximum value. The temperature monitoring unit TM outputs a measurement request req5 to the temperature sensor TS at a timing at which the timer reaches the maximum value, for example, to acquire the measured temperature Ta from the temperature sensor TS. In summary, the temperature monitoring unit TM repeatedly acquires the measured temperature Ta from the temperature sensor TS. The temperature monitoring unit TM outputs the measured temperature Ta acquired from the temperature sensor TS to the mode determination unit MD. The maximum value (limit value) of the timer is stored, for example, in the storage unit REG. As a matter of course, the configuration of the timer is not limited to the aforementioned configuration.

The reference temperature calculation unit RC starts to calculate the reference temperature Tref in response to the start request req1 of the subroutine 1 output from the CPU. The reference temperature calculation unit RC includes a timer therein. This timer has a configuration similar to that of the timer of the temperature monitoring unit TM. The temperature monitoring unit TM outputs a measurement request req3 such as an active cycle ac1 to the cycle measurement unit CM at a timing at which the timer reaches the maximum value, for example. In summary, the reference temperature calculation unit RC repeatedly outputs the measurement request req3 to the cycle measurement unit CM. The maximum value (limit value) of the timer is stored, for example, in the storage unit REG. The active cycle ac1 [Hz] is, for example, a total number of cycles of the operation clock per unit time in which the semiconductor device is in the active state.

Further, the reference temperature calculation unit RC acquires, upon receiving a reference change request req4 output from the comparison unit CMP, a calculation basic data d1 from the storage unit REG and acquires a calculation measured data d2 from the cycle measurement unit CM. The reference temperature calculation unit RC calculates the reference temperature Tref using the calculation basic data d1 and the calculation measured data d2 that have been acquired to output the reference temperature Tref to the mode determination unit MD.

The calculation basic data d1 includes a reference temperature calculation formula and an element idle power. The reference temperature calculation formula is a calculation formula to calculate the reference temperature Tref. The element idle power [W/Hz] is an idle power $P_I$ per operating frequency (slope of the idle power $P_I$ shown in FIG. 2A).

The calculation measured data d2 includes an idle cycle $C_I$ and a shutdown rate r. The idle cycle $C_I$ [Hz] is a total number of cycles of the operation clock per unit time in which the semiconductor device is in the idle state. The shutdown rate r is a rate per unit time in which the semiconductor device is in the shutdown state. The shutdown rate r is expressed by a numerical value from 0 to 1. The shutdown rate r=0.2 means that the shutdown rate is 20%.

The cycle measurement unit CM measures the active cycle ac1, the idle cycle $C_I$, and the shutdown rate r in response to the measurement request req3 output from the reference temperature calculation unit RC. The cycle measurement unit CM outputs the acquired active cycle ac1 to the comparison unit CMP. Further, the cycle measurement unit CM stores, in response to the reference change request req4 output from the comparison unit CMP, the acquired active cycle ac1 in the storage unit REG as a new reference active cycle ac2. On the other hand, the cycle measurement unit CM outputs the idle cycle $C_I$ and the shutdown rate r that have been measured to the reference temperature calculation unit RC as the calculation measured data d2.

The storage unit REG is a register that holds various data. The storage unit REG according to this embodiment holds limit values of the timers included in the temperature monitoring unit TM and the reference temperature calculation unit RC, the calculation basic data d1, and the reference active cycle ac2. The various data held by the storage unit REG is initialized according to the initializing signal rst output from the CPU when the system starts.

The comparison unit CMP compares the active cycle ac1 acquired from the cycle measurement unit CM with the reference active cycle ac2 held in the storage unit REG. When the change of the active cycle ac1 with respect to the reference active cycle ac2 is large, the comparison unit CMP outputs to the reference temperature calculation unit RC the reference change request req4 to change the reference temperature Tref. On the other hand, when the change of the active cycle ac1 with respect to the reference active cycle ac2 is small, the comparison unit CMP does not output the reference change request req4 to the reference temperature calculation unit RC.

More specifically, for example, the comparison unit CP does not output the reference change request req4 when ac2×0.9<ac1<ac2×1.1 is satisfied, whereas the comparison unit CP outputs the reference change request req4 when ac2×0.9<ac1<ac2×1.1 is not satisfied. As described above, the reference change request req4 output from the comparison unit CMP is also input to the cycle measurement unit CM. The cycle measurement unit CM stores the acquired active cycle ac1 in the storage unit REG as the new reference active cycle ac2. However, when the comparison unit CMP outputs the reference change request req4, the active cycle ac1 compared by the comparison unit CMP may be stored in the storage unit REG as the new reference active cycle ac2.

The mode determination unit MD compares the reference temperature Tref acquired from the reference temperature calculation unit RC with the measured temperature Ta acquired from the temperature monitoring unit TM to determine the power reduction mode. Specifically, for example, the idle power reduction mode is selected when Ta<Tref is satisfied, whereas the leakage power reduction mode is selected when Ta<Tref is not satisfied. The mode determination unit MD outputs a mode signal (control signal) mod according to the determination result to the clock generation unit CPG.

The clock generation unit CPG generates the operation clock ck1 of the CPU according to the mode signal mod output from the mode determination unit MD. Specifically, in the idle power reduction mode, the clock generation unit CPG sets the frequency of the operation clock ck1 to be output (operating frequency) to be low. In the leakage power reduction mode, the clock generation unit CPG sets the frequency of the operation clock ck1 to be output to be high.

The power supply controller PSC outputs a power supply enable signal psen1 to control ON/OFF of a power supply switch SW1 connected to the CPU. The ON/OFF of the power supply switch SW1 is controlled according to the state of the CPU. Specifically, when the CPU is in the active state or the idle state, the power supply switch SW1 is ON and a power supply voltage is supplied to the CPU. On the other hand, when the CPU is in the shutdown state, the power supply switch SW1 is OFF and the supply of the power supply voltage to the CPU is stopped. The power supply switch SW1 is composed of, for example, a MOSFET, and the power supply enable signal psen1 is input to the gate terminal (control terminal) of the power supply switch SW1.

<Power Reduction Mode Control Method (Main Routine)>

Figure 8:
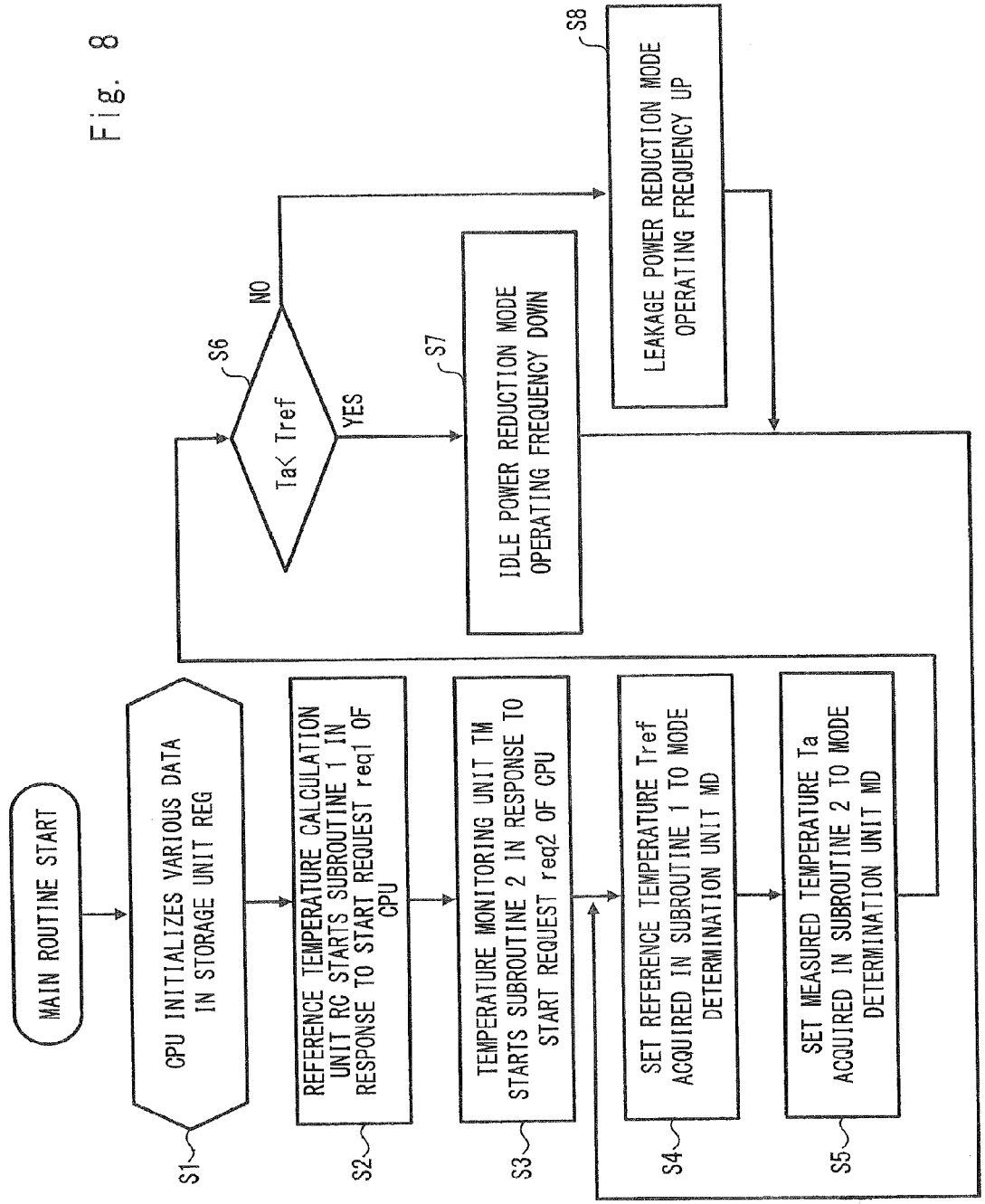
FIG. 8 is a flowchart for describing a power reduction mode control method (main routine) according to the first embodiment.

Referring next to FIG. 8, a power reduction mode control method (main routine) in the semiconductor device according to the first embodiment will be described. FIG. 8 is a flowchart for describing the power reduction mode control method (main routine) according to the first embodiment.

When the system starts, the CPU starts the main routine. As shown in FIG. 8, the CPU first outputs the initializing signal rst to the storage unit REG to initialize various data stored in the storage unit REG (the limit values of the timers included in the temperature monitoring unit TM and the reference temperature calculation unit RC, the calculation basic data d1, and the reference active cycle ac2) (Step S1).

Next, the CPU outputs to the reference temperature calculation unit RC the start request req1 of the subroutine 1 to calculate the reference temperature Tref. The reference temperature calculation unit RC starts the subroutine 1 in response to the start request req1 (Step S2). The details of the subroutine 1 will be described later.

Next, the CPU outputs to the temperature monitoring unit TM the start request req2 of the subroutine 2 to acquire the measured temperature Ta. The temperature monitoring unit TM starts, in response to the start request req2, the subroutine 2 (Step S3). The details of the subroutine 2 will be described later. The order of Step S2 and Step S3 may be reversed.

Next, the reference temperature calculation unit RC sets the reference temperature Tref acquired in the subroutine 1 to the mode determination unit MD (Step S4). Further, the temperature monitoring unit TM sets the measured temperature Ta acquired in the subroutine 2 to the mode determination unit MD (Step S5). Note that the order of Step S4 and Step S5 may be reversed.

Next, the mode determination unit MD compares the measured temperature Ta with the reference temperature Tref to determine whether Ta<Tref is satisfied (Step S6). When Ta<Tref is satisfied (YES in Step S6), the mode determination unit MD selects the idle power reduction mode and the clock generation unit CPG sets the frequency of the operation clock ck1 of the CPU to be low (Step S7). The clock generation unit CPG sets the frequency of the operation clock ck1 of the CPU to, for example, the mini-mum frequency at which the CPU can operate without disrupting the processing. After that, the process goes back to Step S4, and the mode determination is repeated.

On the other hand, when Ta<Tref is not satisfied (NO in Step S6), the mode determination unit MD selects the leakage power reduction mode and the clock generation unit CPG sets the frequency of the operation clock ck1 of the CPU to be high (Step S8). The clock generation unit CPG sets the frequency of the operation clock ck1 of the CPU to, for example, the maximum frequency at which the CPU can operate. After that, the process goes back to Step S4, and the mode determination is repeated.

<Reference Temperature Calculation Method (Subroutine 1)>

Figure 9:
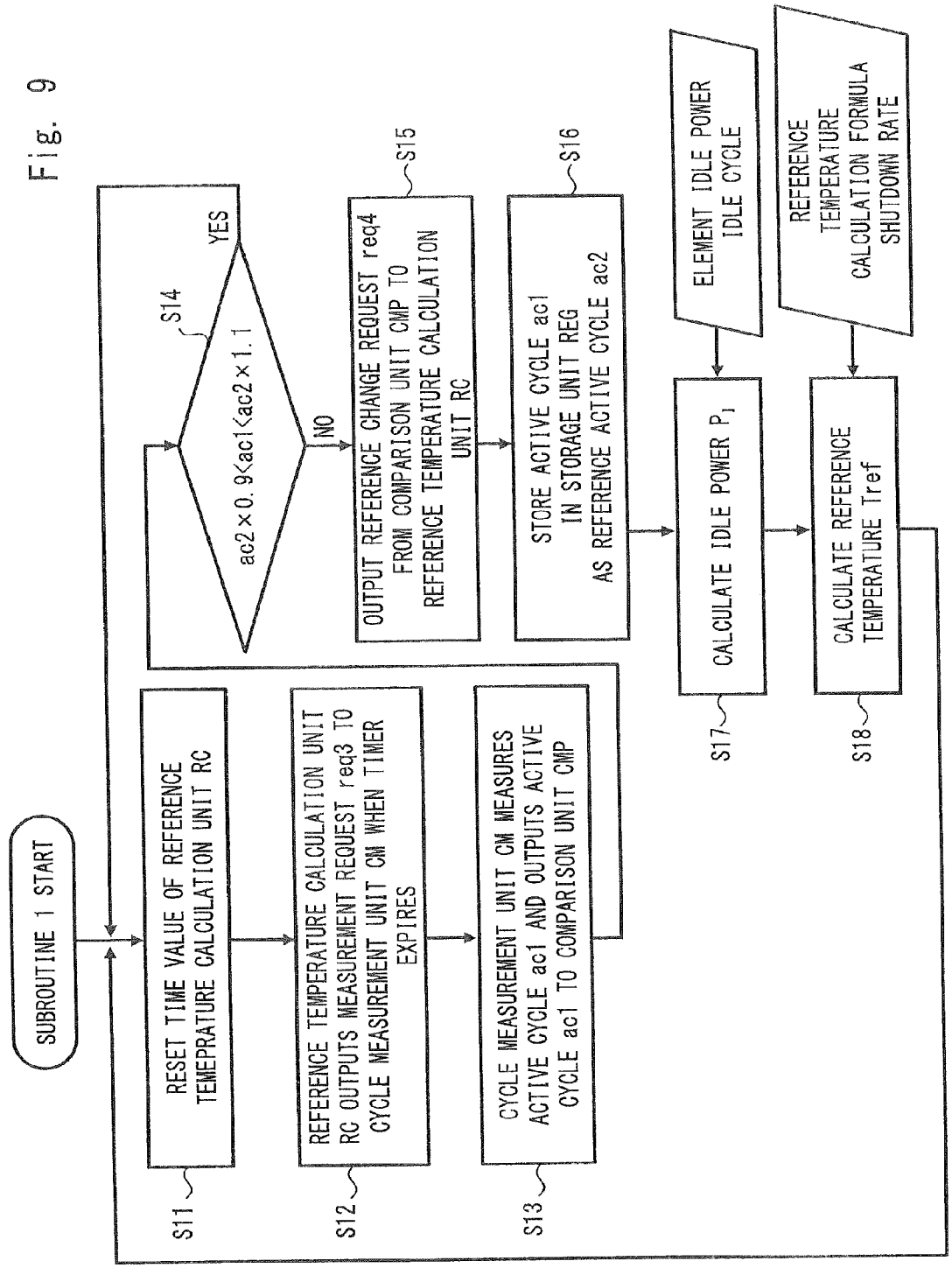
FIG. 9 is a flowchart for describing a reference temperature calculation method (subroutine 1) according to the first embodiment.

Next, with reference to FIG. 9, a method for calculating the reference temperature Tref (subroutine 1) in the semiconductor device according to the first embodiment will be described. FIG. 9 is a flowchart for describing the method for calculating the reference temperature (subroutine 1) according to the first embodiment.

The reference temperature calculation unit RC starts, in response to the start request req1 of the subroutine 1 from the CPU, the subroutine 1.

First, the reference temperature calculation unit RC resets the value of the timer included therein (Step S11).

Next, when the timer reaches the limit value (i.e., when the timer expires), the reference temperature calculation unit RC outputs the measurement request req3 for the active cycle ac1 to the cycle measurement unit CM (Step S12).

Next, the cycle measurement unit CM measures, in response to the measurement request req3 from the reference temperature calculation unit RC, the active cycle ac1 and outputs the active cycle ac1 to the comparison unit CMP (Step S13). The cycle measurement unit CM also measures the idle cycle $C_I$ [Hz] and the shutdown rate r in addition to the active cycle ac1.

Next, the comparison unit CMP compares the active cycle ac1 acquired from the cycle measurement unit CM with the reference active cycle ac2 stored in the storage unit REG. Specifically, the comparison unit CMP determines, for example, whether ac2×0.9<ac1<ac2×1.1 is satisfied (Step S14). That is, the comparison unit CMP determines whether the change of the active cycle ac1 with respect to the reference active cycle ac2 is smaller than 10%. The numerical value 10% is merely an example and may be set as appropriate according to the purpose, the application and the like.

When ac2×0.9<ac1<ac2×1.1 is satisfied (YES in Step S14), the comparison unit CMP does not output the reference change request req4 to the reference temperature calculation unit RC, and the process goes back to Step S11. That is, when the change of the active cycle ac1 with respect to the reference active cycle ac2 is small, the comparison unit CMP does not output the reference change request req4 to the reference temperature calculation unit RC.

On the other hand, when ac2×0.9<ac1<ac2×1.1 is not satisfied (NO in Step S14), the comparison unit CMP outputs the reference change request req4 to the reference temperature calculation unit RC (Step S15). That is, when the change of the active cycle ac1 with respect to the reference active cycle ac2 is large, the comparison unit CMP outputs the reference change request req4 to the reference temperature calculation unit RC. The reference change request req4 is also input to the cycle measurement unit CM.

Next, the cycle measurement unit CM stores, in response to the reference change request req4, the active cycle ac1 in the storage unit REG as the new reference active cycle ac2

(Step S16). That is, when the reference temperature Tref is updated, the reference active cycle ac2 is also updated.

Next, the reference temperature calculation unit RC calculates, in response to the reference change request req4, the idle power $P_I$ [W] using the element idle power $E_I$ [W/Hz] stored in the storage unit REG and the idle cycle $C_I$ [Hz] acquired from the cycle measurement unit CM (Step S17). Specifically, the idle power $P_I$ [W] is calculated from the expression of $P_I$ [W]=$E_I$ [W/Hz]×$C_I$ [Hz].

Next, the reference temperature calculation unit RC calculates the reference temperature Tref using the shutdown rate and the reference temperature calculation formula stored in the storage unit REG (Step S18). After that, the process goes back to Step S11 and repeats the flow of Steps S11-S18.

An example of the reference temperature calculation formula used to calculate the reference temperature Tref will be shown below.

First, the leakage current $i_L$ [A] per transistor can be expressed by the following Expression 1 using a coefficient α [A/nm], a gate width W [nm], a threshold voltage $V_T$[V], a subthreshold coefficient n, and a temperature voltage Ut[V]. The coefficient α and the subthreshold coefficient n can be obtained from experiments and the like.

$$i_L = \alpha W \exp\{-V_T/(nUt)\} \quad \text{(Expression 1)}$$

The temperature voltage Ut[V] may be expressed by the following Expression 2 using the Boltzmann constant k=1.38×10$^{-23}$ [J/K], the absolute temperature T[K], and the quantum of electricity q=1.6×10$^{-19}$[C].

$$Ut = kT/q \quad \text{(Expression 2)}$$

Now, the leakage current $I_L$ [A] of the semiconductor device may be expressed by the following Expression 3 from Expressions 1 and 2 using the number of transistors N forming the semiconductor device and the shutdown rate r.

$$I_L = \alpha W N (1-r) \exp\{-qV_T/(nkT)\} \times \quad \text{(Expression 3)}$$

From Expression 3, the absolute temperature T[K] may be expressed by the following Expression 4.

$$T = -qV_T/(nk)/\ln[I_L/\{\alpha W N(1-r)\}] \quad \text{(Expression 4)}$$

The absolute temperature T[K] of Expression 4 may be expressed as a Celsius temperature $T_C$[° C.] (=T-$T_0$) by the following Expression 5. The absolute temperature of 0° C.: $T_0$ is 273.15[K].

$$T_C = -qV_T/(nk)/\ln[I_L/\{\alpha W N(1-r)\}] - T_0 \quad \text{(Expression 5)}$$

The temperature when the ratio of the idle power $P_I$ [W] (=idle current $I_I$ [A]×operating voltage V[V]) to the leakage power $P_L$ [W](=leakage current $I_L$ [A]×operating voltage V[V]) is 1:m (i.e., the temperature when $I_L$=m$I_I$=m$P_I$/V) is denoted by a reference temperature Tref[° C.]. The reference temperature Tref[° C.] can be expressed by the following Expression 6 from Expression 5. While the value of m may be determined as appropriate, it may be, for example, about 10.

$$\text{Tref} = -qV_T/(nk)/\ln[(mP_I/V)/\{\alpha W N(1-r)\}] - T_0 \quad \text{(Expression 6)}$$

This Expression 6 is the reference temperature calculation formula. By substituting the idle power $P_I$ [W] calculated in Step S17 and the shutdown rate r acquired from the cycle measurement unit CM into Expression 6, the reference temperature Tref[° C.] can be obtained.

<Measured Temperature Acquisition Method (Subroutine 2)>

Figure 10:
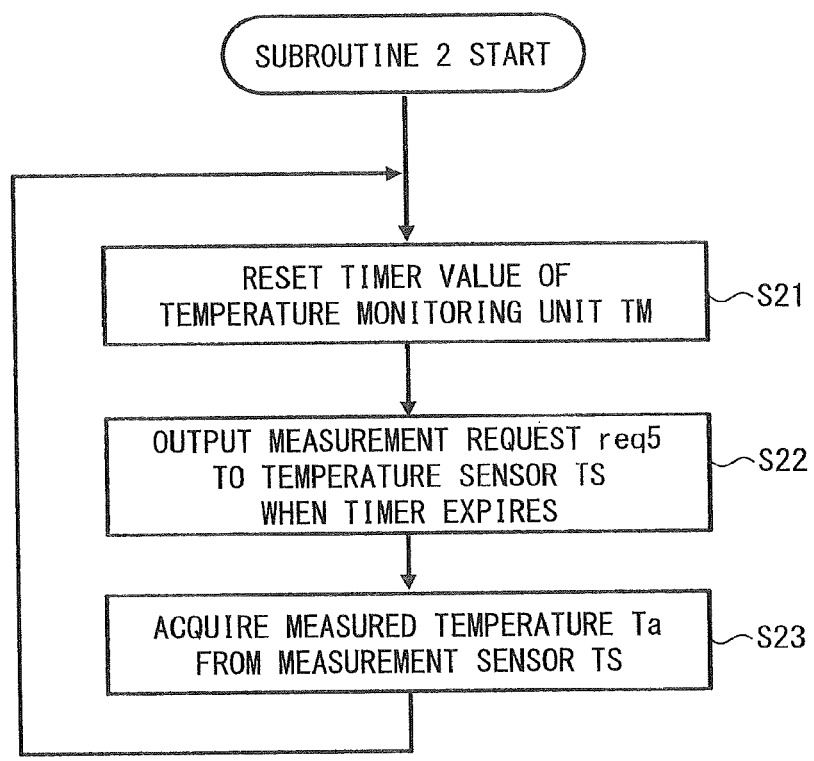
FIG. 10 is a flowchart for describing a measured temperature acquisition method (subroutine 2) according to the first embodiment.

Next, with reference to FIG. 10, a method for acquiring the measured temperature Ta (subroutine 2) in the semiconductor device according to the first embodiment will be described. FIG. 10 is a flowchart for describing the measured temperature acquisition method (subroutine 2) according to the first embodiment.

The temperature monitoring unit TM starts the subroutine 2 in response to the start request req2 of the subroutine 2 from the CPU.

First, the temperature monitoring unit TM resets the value of the timer included therein (Step S21).

Next, when the timer reaches the limit value (i.e., when the timer expires), the temperature monitoring unit TM outputs the temperature measurement request req5 to the temperature sensor TS (Step S22).

Next, the temperature monitoring unit TM acquires the measured temperature Ta output from the temperature sensor TS in response to the measurement request req5 (Step S23). After that, the process goes back to Step S21 and the flow of Steps S21 to S23 is repeated.

<Description of Power Consumption Reduction Effect>

Figure 11A:
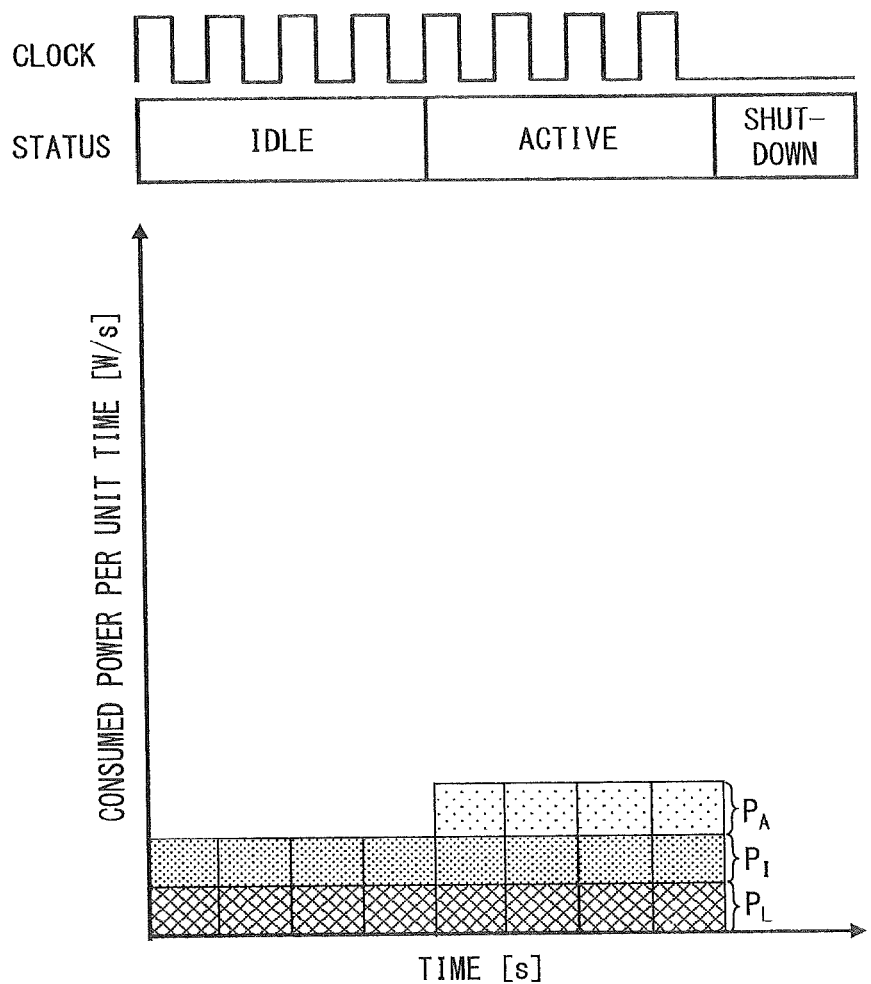
FIG. 11A is a graph schematically showing a configuration of a consumed power when the temperature of the semiconductor device according to an example of the first embodiment is low (measured temperature Ta<reference temperature Tref), which is an idle power reduction mode.
Figure 11B:
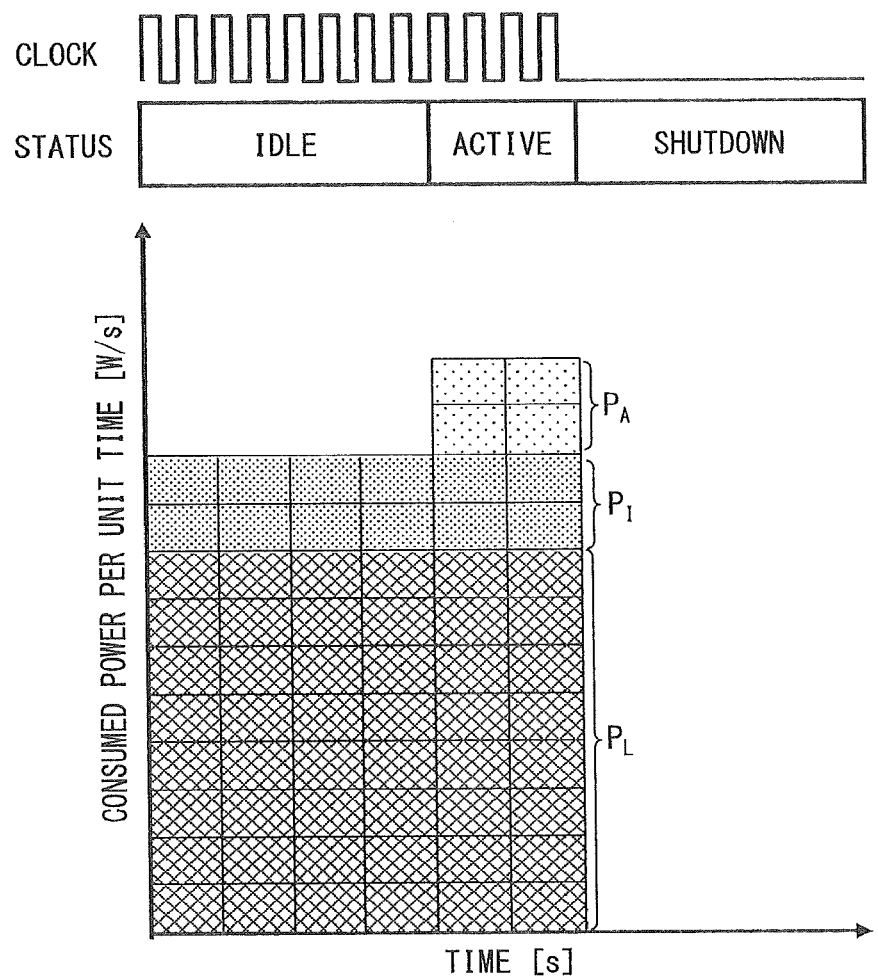
FIG. 11B is a graph schematically showing a configuration of the consumed power when the temperature of the semiconductor device according to the example of the first embodiment is high (reference temperature Tref<measured temperature Ta), which is a leakage power reduction mode.

Referring next to FIGS. 11A and 11B, power consumption reduction effect of the semiconductor device according to this embodiment will be described. FIG. 11A is a graph schematically showing a configuration of the consumed power when the temperature of the semiconductor device according to an example of the first embodiment is low (measured temperature Ta<reference temperature Tref), or the idle power reduction mode. FIG. 11B is a graph schematically showing a configuration of the consumed power when the temperature of the semiconductor device according to the example of the first embodiment is high (reference temperature Tref<measured temperature Ta), or the leakage power reduction mode. FIGS. 11A and 11B are graphs similar to those of FIGS. 4A and 4B according to the comparative example.

In the graphs shown in FIGS. 11A and 11B, the horizontal axis indicates time [s] and the vertical axis indicates a consumed power per unit time [Ws]. The operation clock (CLOCK) and the status (STATUS) are shown according to the time in the horizontal axis. As shown in FIG. 11A, the leakage power $P_L$ and the idle power $P_I$ per unit time are constant regardless of whether the semiconductor device is in the idle state or the active state. The active power $P_A$ is generated only when the semiconductor device is in the active state. The consumed power is not generated when the semiconductor device is in the shutdown state. The same is true for FIG. 11B. The time integration value of the consumed power per unit time shown in each of FIGS. 11A and 11B (i.e., the area of the graph or the number of squares shown in each of FIGS. 11A and 11B) corresponds to the consumed power.

The operating frequency in FIG. 11B is twice as large as that in FIG. 11A. Therefore, the idle power $P_I$ per unit time in FIG. 11B is also twice as large as that in FIG. 11A. On the other hand, the leakage power $P_L$ per unit time in FIG. 11B is eight times as large as that in FIG. 11A due to the increase in the temperature. The total active power $P_A$ required for the processing in FIG. 11A is the same as that in FIG. 11B. Accordingly, the time during which the semiconductor device is in the active state in FIG. 11B is shorter than that in FIG. 11A (the time during which the semiconductor device is in the shutdown state increases).

By comparing FIG. 11A according to the example with FIG. 4A according to the comparative example, the power consumption reduction effect in the idle power reduction mode will be described. Since the operating frequency in FIG. 11A is half as large as that in FIG. 4A, the idle power $P_I$ per unit time in FIG. 11A is half as large as that in FIG.

4A. On the other hand, since the total active power $P_A$ required for the processing in FIG. 11A is the same as that in FIG. 4A, the time required for the processing in FIG. 11A (time during which the semiconductor device is in the active state) becomes twice as large as that in FIG. 4A. Since the temperature in FIG. 11A is the same as that in FIG. 4A, the leakage power $P_L$ per unit time in FIG. 11A is the same as that in FIG. 4A.

Since the time during which the semiconductor device is in the active state in FIG. 11A is twice as long as that in FIG. 4A, the leakage power $P_L$ increases in FIG. 11A. However, since the leakage power $P_L$ per unit time is small when the temperature of the semiconductor device is low, the idle power $P_I$ per unit time in FIG. 11A becomes half of that in FIG. 4A due to the idle power reduction effect. Therefore, it is possible to reduce the power consumption as a whole. More specifically, while the leakage power $P_L$ increases by two squares in FIG. 11A compared to that in FIG. 4A, the idle power $P_I$ decreases by four squares in FIG. 11A compared to that in FIG. 4A. It is therefore possible to reduce the power consumption by two squares as a whole.

Next, by comparing FIG. 11B according to the example with FIG. 4B according to the comparative example, the power consumption reduction effect in the leakage power reduction mode will be described. Since the operating frequency in FIG. 11B is twice as large as that in FIG. 4B, the idle power $P_I$ per unit time in FIG. 11B is twice as large as that in FIG. 4B. On the other hand, since the total active power $P_A$ required for the processing in FIG. 11B is the same as that in FIG. 4B, the time required for the processing (time during which the semiconductor device is in the active state) in FIG. 11B is half as large as that in FIG. 4B. Since the temperature in FIG. 11B is the same as that in FIG. 4B, the leakage power $P_L$ per unit time in FIG. 11B is the same as that in FIG. 4B.

The idle power $P_I$ per unit time in FIG. 11B is twice as large as the idle power $P_I$ per unit time in FIG. 4B. However, since the leakage power $P_L$ per unit time is large when the temperature of the semiconductor device is high, the leakage power can be reduced by reducing the time during which the semiconductor device is in the active state (increasing the time during which the semiconductor device is in the shutdown state). Therefore, it is possible to reduce the power consumption as a whole. More specifically, while the idle power $P_I$ increases by four squares in FIG. 11B compared to that in FIG. 4B, the leakage power $P_L$ decreases by 16 squares. It is therefore possible to reduce the power consumption by 12 squares as a whole.

Figure 12:
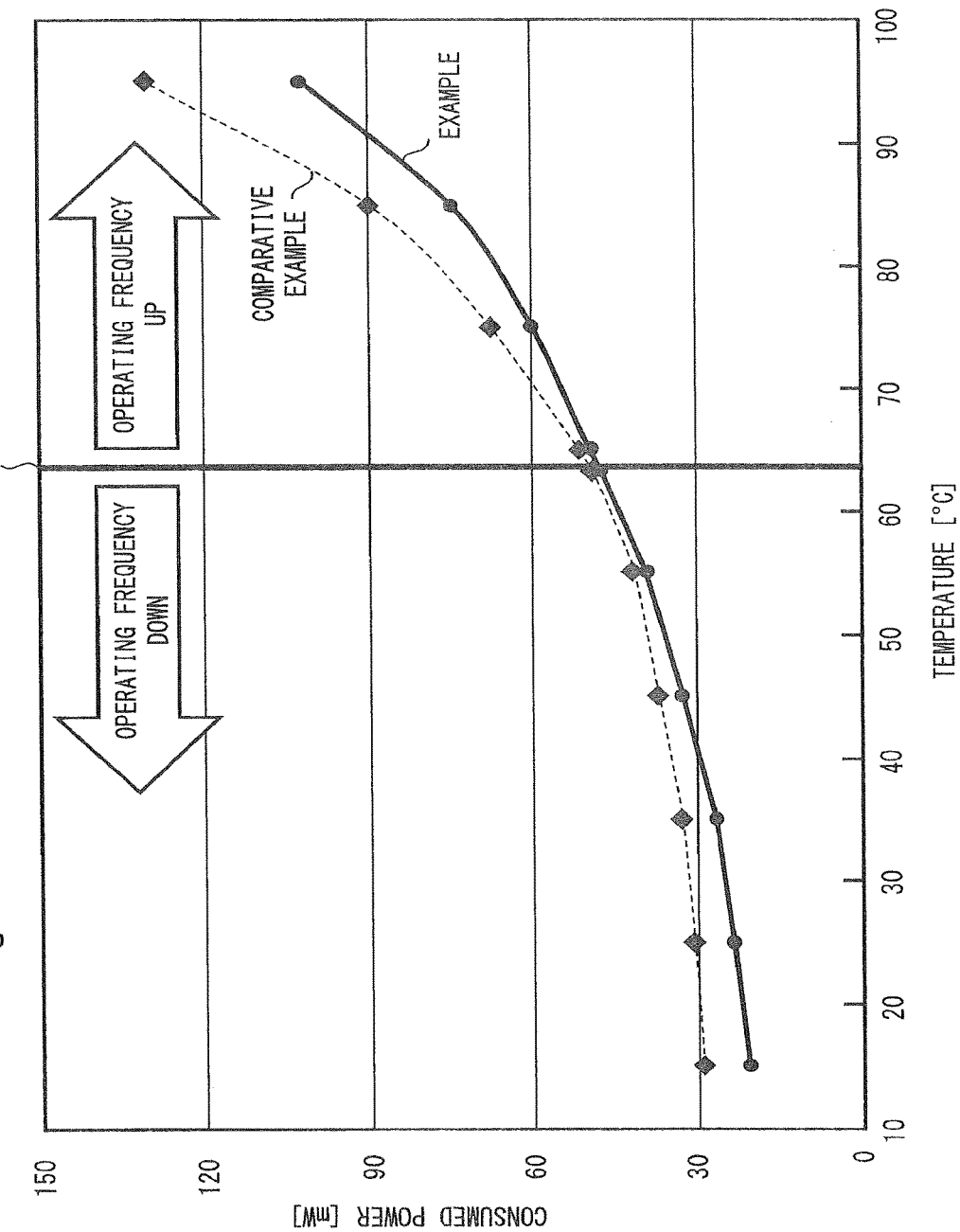
FIG. 12 is a graph schematically showing temperature dependencies of the power consumed in the semiconductor device according to the example of the first embodiment.

FIG. 12 is a graph showing temperature dependencies of the power consumed in the semiconductor device according to the example of the first embodiment shown in FIGS. 11A and 11B. The horizontal axis indicates the temperature [° C.] and the vertical axis indicates the consumed power [mW], and the power consumed in the example is indicated by a solid line. FIG. 12 also shows the power consumed in the semiconductor device according to the comparative example shown in FIGS. 4A and 4B by a dashed line.

In the example, the operating frequency is controlled to be decreased when the temperature is lower than the reference temperature Tref, and the operating frequency is controlled to be increased when the temperature is higher than the reference temperature Tref. On the contrary, in the comparative example, the operating frequency is controlled to be increased when the temperature is lower than the reference temperature Tref, and the operating frequency is controlled to be decreased when the temperature is higher than the reference temperature Tref.

As shown in FIG. 12, for the whole temperature range, the power consumed in the example is smaller than that in the comparative example. If the temperature is around the reference temperature Tref, the difference between the power consumed in the example and the power consumed in the comparative example is small. However, this difference becomes larger in accordance with an increase or a decrease in the temperature from the reference temperature Tref. In particular, the leakage power reduction effect in a high-temperature region is large.

As described above, in the semiconductor device according to this embodiment, it is determined which one of the idle power $P_I$ that increases in proportion to the operation frequency and the leakage power $P_L$ that sharply increases in accordance with the increase in the temperature should be reduced to further contribute to the reduction in the consumed power as a whole by comparing the reference temperature Tref with the measured temperature Ta. The consumed power is reduced by appropriately controlling the operating frequency based on this comparison result.

Specifically, when the measured temperature Ta is smaller than the reference temperature Tref and the leakage power $P_L$ is small, the power reduction mode controller (controller) 100 controls the operating frequency to be low. Accordingly, the idle power $P_I$ is reduced, whereby it is possible to reduce the power consumption as a whole. On the other hand, when the measured temperature Ta is larger than the reference temperature Tref and the leakage power $P_L$ is large, the power reduction mode controller (controller) 100 controls the operating frequency to be high. In summary, the leakage power $P_L$ can be reduced by reducing the time during which the semiconductor device is in the active state (increasing the time during which the semiconductor device is in the shutdown state), whereby it is possible to reduce the power consumption as a whole.

Further, according to the reduction of the power consumption, heat generated from the semiconductor device can be suppressed. It is therefore possible to suppress thermal runaway of the semiconductor device according to the increase in the chip temperature. In summary, the reliability of the semiconductor device is also improved.

Second Embodiment

<Configuration of Semiconductor Device According to Second Embodiment>

Figure 13:
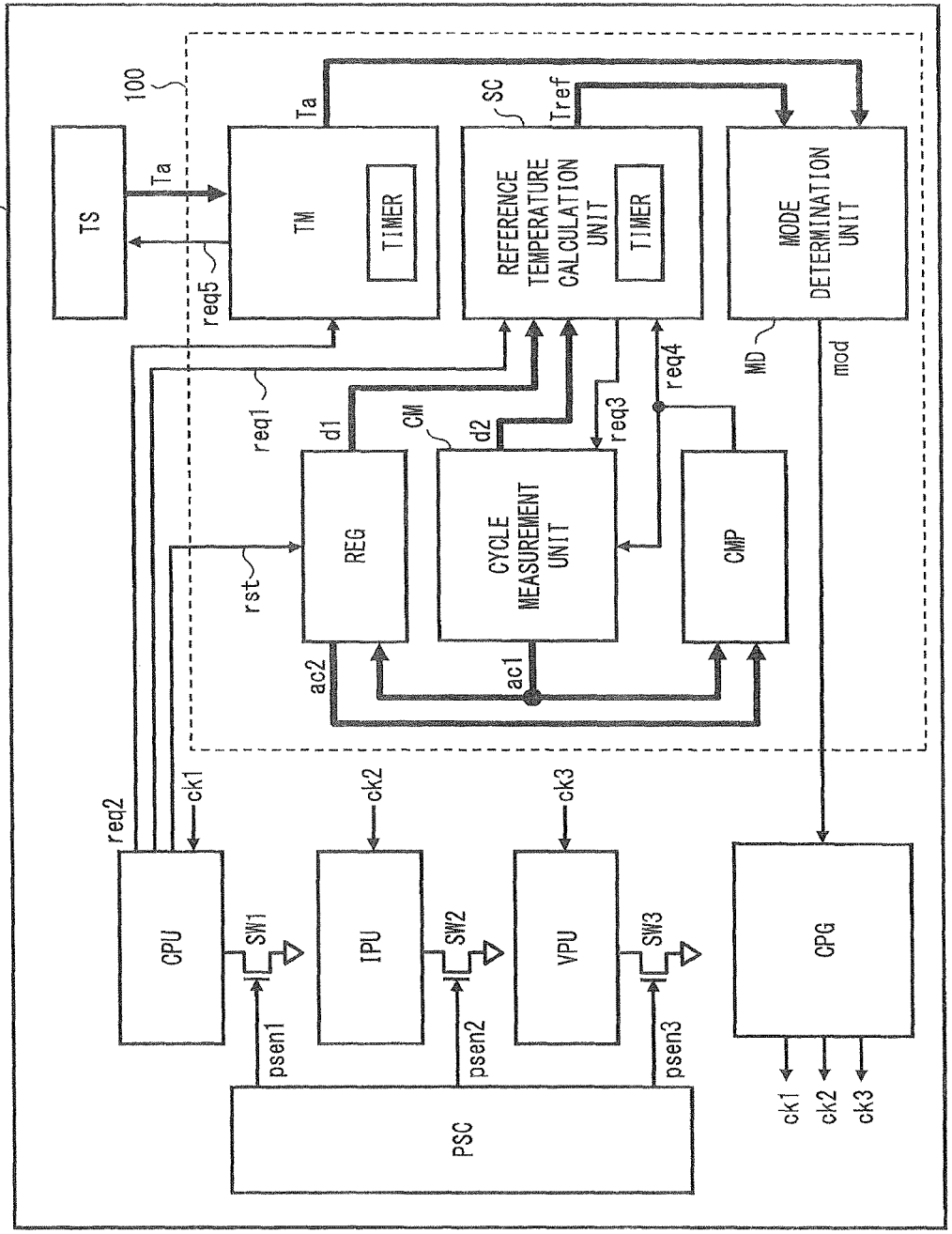
FIG. 13 is a block diagram showing an exemplary structure of an application processor 601 according to a second embodiment.

With reference to FIG. 13, the configuration of the application processor 601, which is a semiconductor device according to a second embodiment, will be described. FIG. 13 is a block diagram showing an exemplary structure of the application processor 601 according to the second embodiment. As shown in FIG. 13, the application processor 601 according to the second embodiment includes, in addition to the configuration of the application processor 601 according to the first embodiment shown in FIG. 7, an image processing unit IPU and a voice processing unit VPU. In FIG. 13, thick arrows indicate data and thin arrows indicate various control signals and clocks.

The image processing unit IPU is a processor dedicated for image processing and is composed of, for example, a Digital Signal Processor (DSP). The image processing unit IPU receives an operation clock ck2 output from the clock generation unit CPG. In the semiconductor device according to this embodiment, the image processing unit IPU executes processing in, for example, the use case which requires image processing such as video reproduction, and is always in the shutdown state in the use case which does not require image processing.

The voice processing unit VPU is a processor dedicated for voice processing, and is composed of, for example, a Digital Signal Processor (DSP). The voice processing unit VPU receives an operation clock ck3 output from the clock generation unit CPG. In the semiconductor device according to this embodiment, the voice processing unit VPU executes processing in, for example, the use case which requires voice processing such as music reproduction, and is always in the shutdown state in the use case which does not require voice processing.

The power supply controller PSC outputs the power supply enable signal psen1 that controls ON/OFF of the power supply switch SW1 connected to the CPU. Further, the power supply controller PSC outputs a power supply enable signal psen2 that controls the ON/OFF of a power supply switch SW2 connected to the image processing unit IPU. Further, the power supply controller PSC outputs a power supply enable signal psen3 that controls the ON/OFF of a power supply switch SW3 connected to the voice processing unit VPU. The power supply switches SW1 to SW3 are each composed of, for example, a MOSFET, and the power supply enable signals psen1 to psen3 are input to the gate terminals (control terminals) of the power supply switches SW1 to SW3, respectively.

The ON/OFF of the power supply switch SW1 is controlled according to the state of the CPU. Specifically, when the CPU is in the active state or the idle state, the power supply switch SW1 is ON. On the other hand, when the CPU is in the shutdown state, the power supply switch SW1 is OFF.

Similarly, the ON/OFF of the power supply switch SW2 is controlled according to the state of the image processing unit IPU. Specifically, when the image processing unit IPU is in the active state or the idle state, the power supply switch SW2 is ON. On the other hand, when the image processing unit IPU is in the shutdown state, the power supply switch SW2 is OFF.

Similarly, the ON/OFF of the power supply switch SW3 is controlled according to the state of the voice processing unit VPU. Specifically, when the voice processing unit VPU is in the active state or the idle state, the power supply switch SW3 is ON. On the other hand, when the voice processing unit VPU is in the shutdown state, the power supply switch SW3 is OFF.

Since the other configurations are similar to those of the semiconductor device according to the first embodiment, detailed descriptions thereof will be omitted.

<Details of Operations of Semiconductor Device According to Second Embodiment>

Next, with reference to FIGS. 14A to 14E, the details of operations of the semiconductor device according to the second embodiment will be described. FIGS. 14A to 14E are sequence diagrams for describing the details of the power reduction mode control method according to the actual use cases (music reproduction and video reproduction). The numbers from <1> to <11> are shown at the left end of FIGS. 14A to 14E. The descriptions will be made in this order.

<1> Operation when System Starts

Figure 14A:
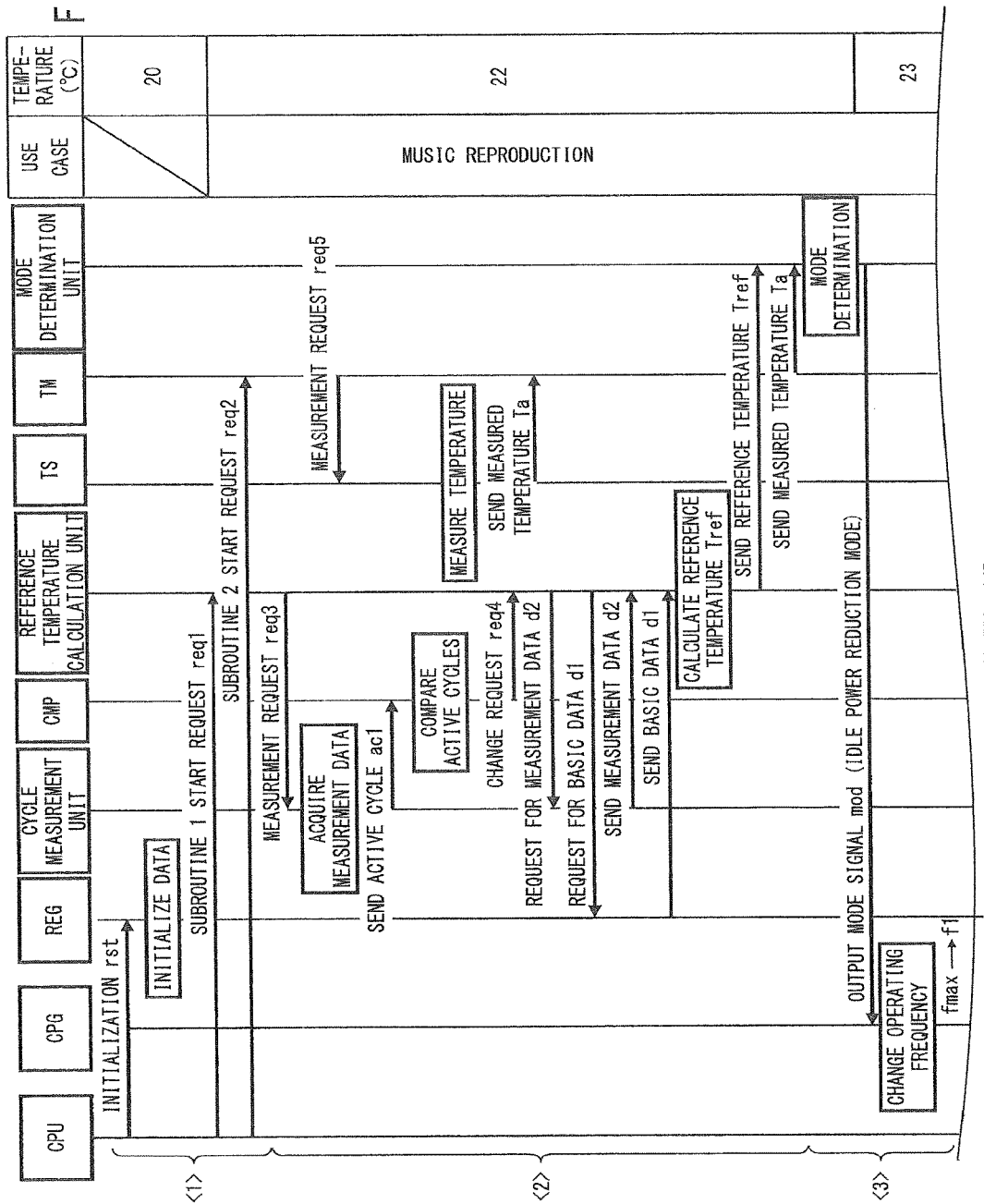
FIG. 14A is a sequence diagram for describing details of a power reduction mode control method according to an actual use case (music reproduction and video reproduction)

When the system starts, the CPU starts the main routine. First, as shown in FIG. 14A, the CPU outputs the initializing signal rst to the storage unit REG to initialize various data stored in the storage unit REG (the limit values of the timers included in the temperature monitoring unit TM and the reference temperature calculation unit RC, the calculation basic data d1, and the reference active cycle ac2). The chip temperature when the system starts is 20° C., and the use case after the start is music reproduction.

Next, the CPU outputs to the reference temperature calculation unit RC the start request req1 to request the reference temperature calculation unit RC to start the subroutine 1 to calculate the reference temperature Tref. Further, the CPU outputs to the temperature monitoring unit TM the start request req2 to request the temperature monitoring unit TM to start the subroutine 2 to acquire the measured temperature Ta.

<2> Reference Temperature Calculation (Subroutine 1) and Measured Temperature Acquisition (Subroutine 2)

The reference temperature calculation unit RC resets the internal timer in response to the start request req1 of the subroutine 1 and outputs the measurement request req3 of the various measured data to the cycle measurement unit CM when the timer expires. The cycle measurement unit CM measures, in response to the measurement request req3, the active cycle ac1 and the calculation measured data d2 (the idle cycle $C_I$ and the shutdown rate r). Next, the cycle measurement unit CM sends the acquired active cycle ac1 to the comparison unit CMP.

The comparison unit CMP compares the active cycle ac1 sent from the cycle measurement unit CM with the reference active cycle ac2 stored in the storage unit REG. Specifically, it is determined whether ac2×0.9<ac1<ac2×1.1 is satisfied, for example. That is, it is determined whether the change of the active cycle ac1 with respect to the reference active cycle ac2 is less than 10%. As described above, the numerical value 10% is merely an example.

Since the above determination is the first determination after the system starts, ac2×0.9<ac1<ac2×1.1 is not satisfied. Therefore, the comparison unit CMP outputs to the reference temperature calculation unit RC the reference change request req4 to change the reference temperature Tref. This reference change request req4 is, for example, an enable signal, and outputting the reference change request req4 means that the value of the enable signal is 1.

The reference change request req4 is also input to the cycle measurement unit CM. The cycle measurement unit CM sends, in response to the reference change request req4, the active cycle ac1 to the storage unit REG as the new reference active cycle ac2 (although not shown in FIG. 14A, this process corresponds to Step S16 in FIG. 9).

The reference temperature calculation unit RC requests, in response to the reference change request req4, the cycle measurement unit CM to send the calculation measured data d2 (the idle cycle $C_I$ and the shutdown rate r). The cycle measurement unit CM sends, in response to this request, the calculation measured data d2 to the reference temperature calculation unit RC.

Further, the reference temperature calculation unit RC requests the storage unit REG to send the calculation basic data d1 (the reference temperature calculation formula and the element idle power). The storage unit REG sends, in response to this request, the calculation basic data d1 to the reference temperature calculation unit RC.

The reference temperature calculation unit RC calculates the idle power $P_I$ [W] using the element idle power $E_I$ [W/Hz] acquired from the storage unit REG and the idle cycle $C_I$ [Hz] acquired from the cycle measurement unit CM. Specifically, the reference temperature calculation unit RC calculates the idle power $P_I$ [W] from the expression $P_I$ [W]=$E_I$ [W/Hz]×$C_I$ [Hz].

Next, the reference temperature calculation unit RC calculates the reference temperature Tref using the idle power $P_I$ calculated by the reference temperature calculation unit RC, the shutdown rate r acquired from the cycle measurement unit CM, and the reference temperature calculation formula acquired from the storage unit REG. In this example, Tref is 63.3° C. The reference temperature calculation unit RC sends the reference temperature Tref that is calculated to the mode determination unit MD.

On the other hand, the temperature monitoring unit TM resets, in response to the start request req2 of the subroutine 2, the internal timer, and outputs the temperature measurement request req5 to the temperature sensor TS when the timer expires. The temperature sensor TS acquires, in response to the measurement request req5, the measured temperature Ta and sends the measured temperature Ta to the temperature monitoring unit TM. In this example, Ta is 22° C. The temperature monitoring unit TM sends the measured temperature Ta acquired from the temperature sensor TS to the mode determination unit MD.

<3> Mode Determination

The mode determination unit MD compares the measured temperature Ta with the reference temperature Tref to determine whether Ta<Tref is satisfied. Since the measured temperature Ta is 22° C. and the reference temperature Tref is 63.3° C., Ta<Tref is satisfied. Therefore, the mode determination unit MD selects the idle power reduction mode. Accordingly, the clock generation unit CPG changes the frequency of the operation clock ck1 to be output (the operating frequency of the CPU) from a maximum frequency fmax [Hz] to an idle power reduction mode frequency f1 [Hz].

<4> Reference Temperature Calculation (Subroutine 1) and Acquisition of Measured Temperature (Subroutine 2)

Next, the description will be made referring to FIG. 14B.

The reference temperature calculation unit RC resets the internal timer after sending the reference temperature Tref to the mode determination unit MD. The reference temperature calculation unit RC outputs the measurement request req3 of various measured data to the cycle measurement unit CM when the timer expires. The cycle measurement unit CM measures, in response to the measurement request req3, the active cycle ac1 and the calculation measured data d2 (the idle cycle $C_I$ and the shutdown rate r). The cycle measurement unit CM then sends the acquired active cycle ac1 to the comparison unit CMP.

The comparison unit CMP compares the active cycle ac1 sent from the cycle measurement unit CM with the reference active cycle ac2 stored in the storage unit REG. Specifically, it is determined whether ac2×0.9<ac1<ac2×1.1 is satisfied, for example. Since the use case is still music reproduction, ac2×0.9<ac1<ac2×1.1 is satisfied. Accordingly, the comparison unit CMP does not output the reference change request req4 to change the reference temperature Tref to the reference temperature calculation unit RC. If the reference change request req4 is the above enable signal, that the reference change request req4 is not output means that the value of the enable signal is 0.

On the other hand, the temperature monitoring unit TM resets the internal timer after sending the measured temperature Ta to the mode determination unit MD, and outputs the temperature measurement request req5 to the temperature sensor TS when the timer expires. The temperature sensor TS acquires, in response to the measurement request req5, the measured temperature Ta and sends the measured temperature Ta to the temperature monitoring unit TM. In this example, Ta=23° C. The temperature monitoring unit TM sends the measured temperature Ta acquired from the temperature sensor TS to the mode determination unit MD.

<5> Mode Determination

The mode determination unit MD compares the measured temperature Ta with the reference temperature Tref to determine whether Ta<Tref is satisfied. Since the measured temperature Ta is 23° C. and the reference temperature Tref is 63.3° C., Ta<Tref is satisfied. Therefore, the mode determination unit MD selects the idle power reduction mode. The operating frequency of the CPU has already reached the idle power reduction mode frequency f1 [Hz]. Therefore, the clock generation unit CPG does not switch the frequency of the operation clock ck1 to be output.

<6> Reference Temperature Calculation (Subroutine 1) and Measured Temperature Acquisition (Subroutine 2)

Next, the description will be made referring to FIG. 14C.

When the reference temperature calculation unit RC does not receive the reference change request req4 from the comparison unit CMP, the reference temperature calculation unit RC resets the internal timer. The reference temperature calculation unit RC then outputs the measurement request req3 of various measured data to the cycle measurement unit CM when the timer expires. The cycle measurement unit CM measures, in response to the measurement request req3, the active cycle ac1 and the calculation measured data d2 (the idle cycle $C_I$ and the shutdown rate r). The cycle measurement unit CM then sends the acquired active cycle ac1 to the comparison unit CMP.

The comparison unit CMP compares the active cycle ac1 sent from the cycle measurement unit CM with the reference active cycle ac2 stored in the storage unit REG. Specifically, it is determined whether ac2×0.9<ac1<ac2×1.1 is satisfied, for example. Since the use case has been changed from music reproduction to video reproduction, ac2× 0.9<ac1<ac2×1.1 is not satisfied. Therefore, the comparison unit CMP outputs the reference change request req4 to change the reference temperature Tref to the reference temperature calculation unit RC.

Figure 14C:
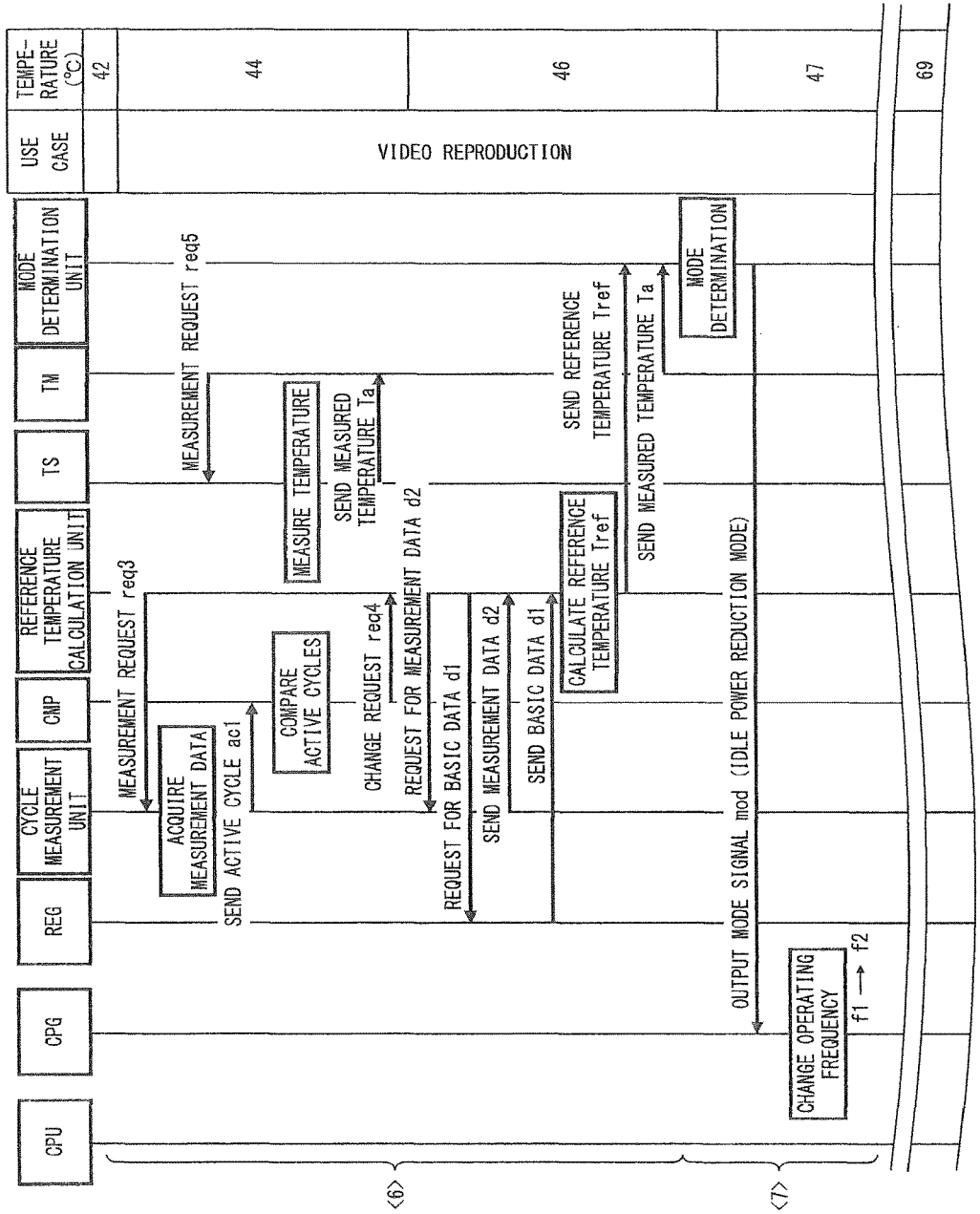
FIG. 14C is a sequence diagram for describing details of the power reduction mode control method according to the actual use case (music reproduction and video reproduction)

This reference change request req4 is also input to the cycle measurement unit CM, and the cycle measurement unit CM sends, in response to the reference change request req4, the active cycle ac1 to the storage unit REG as the new reference active cycle ac2 (although not shown in FIG. 14C, this process corresponds to Step S16 in FIG. 9).

The reference temperature calculation unit RC requests, in response to the reference change request req4, the cycle measurement unit CM to send the calculation measured data d2 (the idle cycle $C_I$ and the shutdown rate r). In response to this request, the cycle measurement unit CM sends the calculation measured data d2 to the reference temperature calculation unit RC.

Further, the reference temperature calculation unit RC requests the storage unit REG to send the calculation basic data d1 (the reference temperature calculation formula and the element idle power). The storage unit REG sends, in response to this request, the calculation basic data d1 to the reference temperature calculation unit RC.

The reference temperature calculation unit RC calculates the idle power $P_I$ [W] using the element idle power $E_I$ [W/Hz] acquired from the storage unit REG and the idle cycle $C_I$ [Hz] acquired from the cycle measurement unit CM. The reference temperature calculation unit RC then calculates the reference temperature Tref using the idle power $P_I$ calculated by the reference temperature calculation unit RC, the shutdown rate r acquired from the cycle measurement unit CM, and the reference temperature calculation formula acquired from the storage unit REG. It is assumed here that Tref=64.4° C. The reference temperature calculation unit RC sends the calculated reference temperature Tref to the mode determination unit MD.

On the other hand, the temperature monitoring unit TM resets the internal timer after sending the measured temperature Ta to the mode determination unit MD, and outputs the temperature measurement request req5 to the temperature sensor TS when the timer expires. The temperature sensor TS acquires, in response to the measurement request req5, the measured temperature Ta and sends the measured temperature Ta to the temperature monitoring unit TM. In this example, Ta=44° C. The temperature monitoring unit TM sends the measured temperature Ta acquired from the temperature sensor TS to the mode determination unit MD.

<7> Mode Determination

The mode determination unit MD compares the measured temperature Ta with the reference temperature Tref to determine whether Ta<Tref is satisfied. Since the measured temperature Ta is 44° C. and the reference temperature Tref is 64.4° C., Ta<Tref is satisfied. Therefore, the mode determination unit MD selects the idle power reduction mode. At this time, the operating frequency of the CPU is the idle power reduction mode frequency f1 [Hz] in the music reproduction. Accordingly, the clock generation unit CPG switches the frequency of the operation clock ck1 to be output to an idle power reduction mode frequency f2 [Hz] in the video reproduction. Since a high-speed operation is required in the video reproduction compared to the operation in the music reproduction, f1<f2 is normally satisfied.

<8> Reference Temperature Calculation (Subroutine 1) and Acquisition of Measured Temperature (Subroutine 2)

Figure 14D:
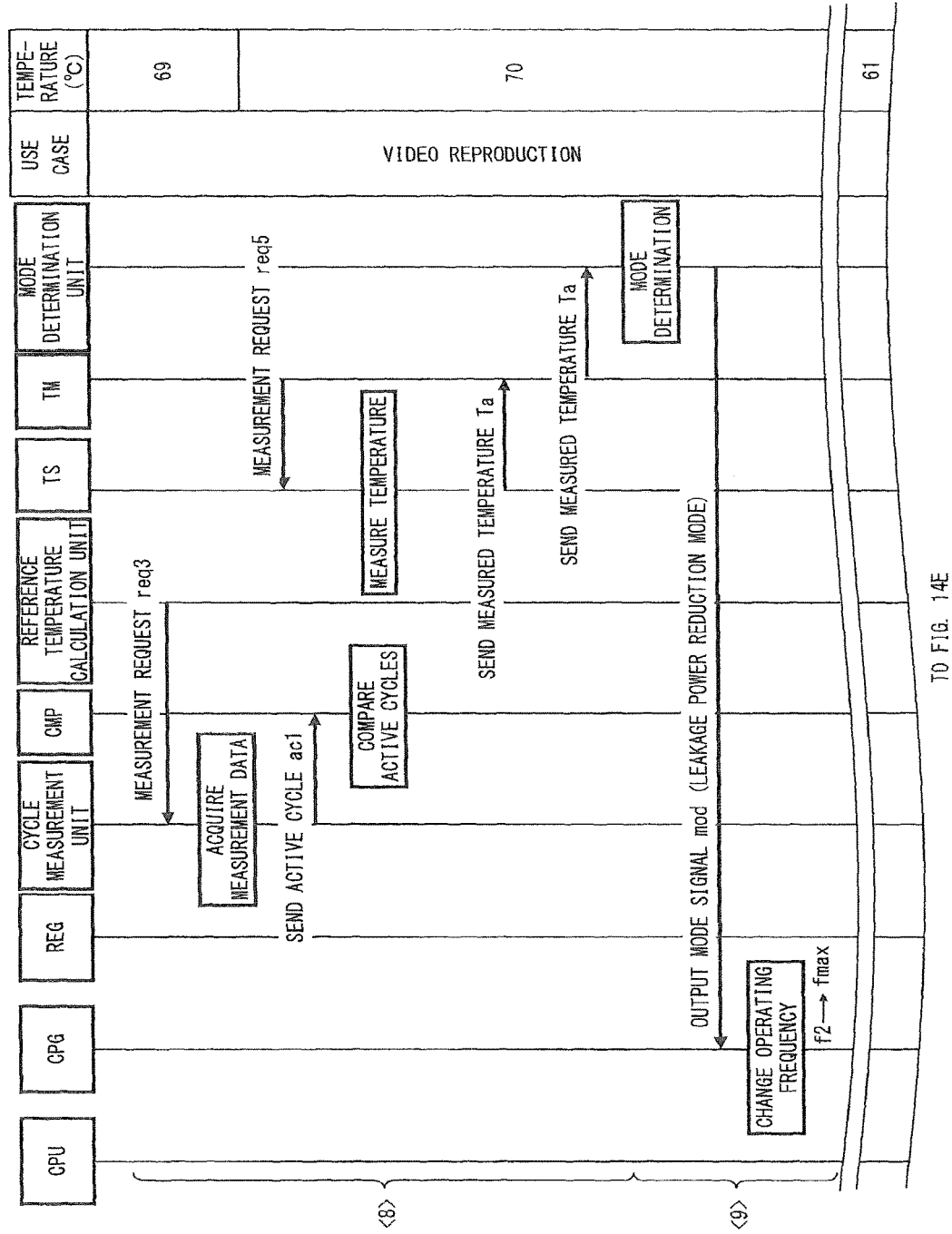
FIG. 14D is a sequence diagram for describing details of the power reduction mode control method according to the actual use case (music reproduction and video reproduction)

Next, the description will be made referring to FIG. 14D.

The reference temperature calculation unit RC resets the internal timer after sending the reference temperature Tref to the mode determination unit MD. The reference temperature calculation unit RC outputs the measurement request req3 of various measured data to the cycle measurement unit CM when the timer expires. The cycle measurement unit CM measures, in response to the measurement request req3, the active cycle ac1 and the calculation measured data d2 (the idle cycle $C_I$ and the shutdown rate r). The cycle measurement unit CM then sends the acquired active cycle ac1 to the comparison unit CMP.

The comparison unit CMP compares the active cycle ac1 sent from the cycle measurement unit CM with the reference active cycle ac2 stored in the storage unit REG. Specifically, it is determined whether ac2×0.9<ac1<ac2×1.1 is satisfied, for example. Since the use case is still the video reproduction, ac2×0.9<ac1<ac2×1.1 is satisfied. Accordingly, the comparison unit CMP does not output the reference change request req4 to change the reference temperature Tref to the reference temperature calculation unit RC.

On the other hand, the temperature monitoring unit TM resets the internal timer after sending the measured temperature Ta to the mode determination unit MD, and outputs the temperature measurement request req5 to the temperature sensor TS when the timer expires. The temperature sensor TS acquires, in response to the measurement request req5, the measured temperature Ta and sends the acquired measured temperature Ta to the temperature monitoring unit TM. In this example, Ta=70° C. The temperature monitoring unit TM sends the measured temperature Ta acquired from the temperature sensor TS to the mode determination unit MD.

<9> Mode Determination

The mode determination unit MD compares the measured temperature Ta with the reference temperature Tref to determine whether Ta<Tref is satisfied. In this example, the measured temperature Ta is 70° C. and the reference temperature Tref is 64.4° C., which means Ta<Tref is not satisfied. Therefore, the mode determination unit MD selects the leakage power reduction mode. Accordingly, the clock generation unit CPG switches the frequency of the operation clock ck1 to be output from the idle power reduction mode frequency f2 [Hz] to the maximum frequency fmax.

<10> Reference Temperature Calculation (Subroutine 1) and Measured Temperature Acquisition (Subroutine 2)

Figure 14E:
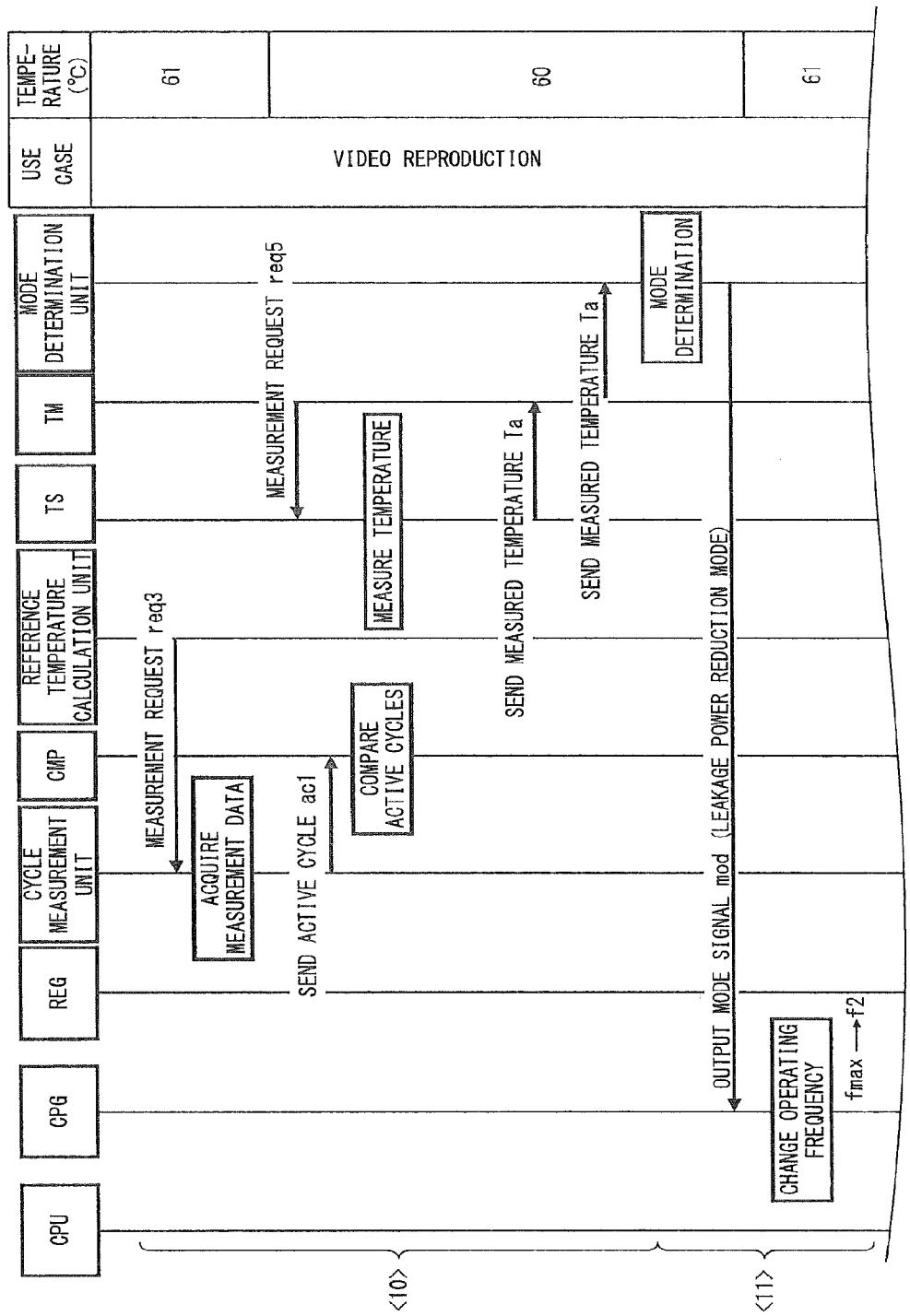
FIG. 14E is a sequence diagram for describing details of the power reduction mode control method according to the actual use case (music reproduction and video reproduction)

Next, the description will be made referring to FIG. 14E.

When the reference temperature calculation unit RC does not receive the reference change request req4 from the comparison unit CMP, the reference temperature calculation unit RC resets the internal timer. The reference temperature calculation unit RC outputs the measurement request req3 of the various measured data to the cycle measurement unit CM when the timer expires. The cycle measurement unit CM measures, in response to the measurement request req3, the active cycle ac1 and the calculation measured data d2 (the idle cycle $C_I$ and the shutdown rate r). Then, the cycle measurement unit CM sends the acquired active cycle ac1 to the comparison unit CMP.

The comparison unit CMP compares the active cycle ac1 sent from the cycle measurement unit CM with the reference active cycle ac2 stored in the storage unit REG. Specifically, it is determined, for example, whether ac2×0.9<ac1<ac2×1.1 is satisfied. Since the use case is still the video reproduction, ac2×0.9<ac1<ac2×1.1 is satisfied. Therefore, the comparison unit CMP does not output the reference change request req4 to change the reference temperature Tref to the reference temperature calculation unit RC.

On the other hand, the temperature monitoring unit TM resets the internal timer after sending the measured temperature Ta to the mode determination unit MD, and outputs the temperature measurement request req5 to the temperature sensor TS when the timer expires. The temperature sensor TS acquires, in response to the measurement request req5, the measured temperature Ta and sends the measured temperature Ta to the temperature monitoring unit TM. In this example, Ta is 60° C. The temperature monitoring unit TM sends the measured temperature Ta acquired from the temperature sensor TS to the mode determination unit MD.

<11> Mode Determination

The mode determination unit MD compares the measured temperature Ta with the reference temperature Tref to determine whether Ta<Tref is satisfied. Since the measured temperature Ta is 60° C. and the reference temperature Tref is 64.4° C., Ta<Tref is satisfied. Therefore, the mode determination unit MD selects the idle power reduction mode. Accordingly, the clock generation unit CPG switches the frequency of the operation clock ck1 to be output from the maximum frequency fmax to the idle power reduction mode frequency f2 [Hz].

As described above, in the semiconductor device according to this embodiment, it is determined which one of the idle power $P_I$ that increases in proportion to the operation frequency and the leakage power $P_L$ that sharply increases in accordance with the increase in the temperature should be reduced to further contribute to the reduction in the consumed power as a whole by comparing the reference temperature Tref with the measured temperature Ta. The consumed power is reduced by appropriately controlling the operating frequency based on this comparison result.

Specifically, when the measured temperature Ta is smaller than the reference temperature Tref and the leakage power $P_L$ is small, the idle power $P_I$ is reduced by decreasing the operating frequency, whereby the power consumption is reduced as a whole. On the other hand, when the measured temperature Ta is equal to or larger than the reference temperature Tref and the leakage power $P_L$ is large, the leakage power $P_L$ is reduced by increasing the operating frequency and decreasing the time during which the semiconductor device is in the active state (increasing the time during which the semiconductor device is in the shutdown state), whereby the power consumption is reduced as a whole.

Further, according to the reduction of the power consumption, heat generated from the semiconductor device can be suppressed. It is therefore possible to suppress thermal runaway of the semiconductor device according to the increase in the chip temperature. In summary, the reliability of the semiconductor device is also improved.

Third Embodiment

<Power Reduction Mode Control Method (Main Routine)>

Figure 15:
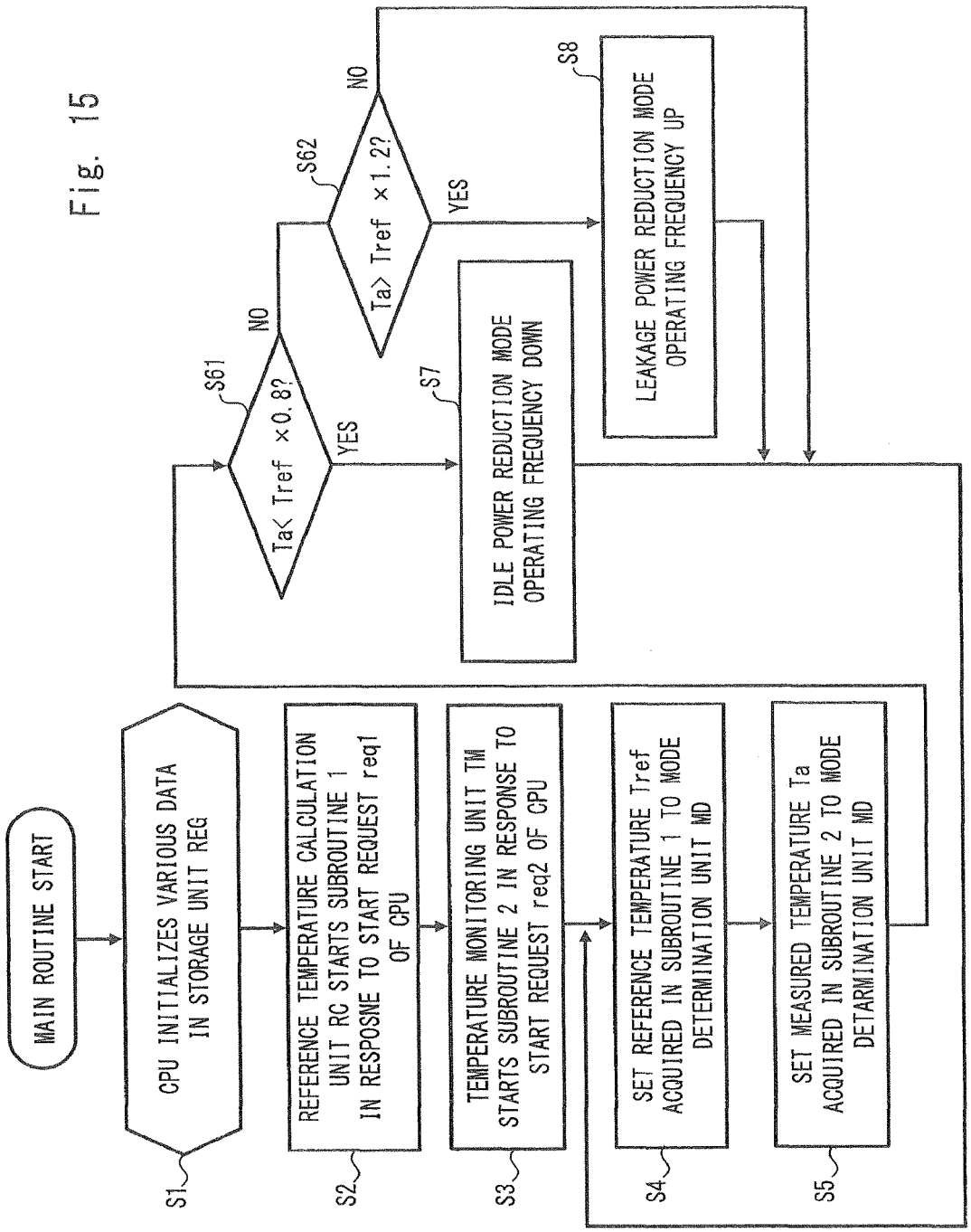
FIG. 15 is a flowchart for describing a power reduction mode control method (main routine) according to a third embodiment.

Referring next to FIG. 15, a power reduction mode control method (main routine) in a semiconductor device according to a third embodiment will be described. FIG. 15 is a flowchart for describing the power reduction mode control method (main routine) according to the third embodiment. The configuration of the semiconductor device according to the third embodiment is similar to that of the semiconductor device according to the first embodiment shown in FIG. 7 except for the determination method in the mode determination unit MD.

Since Steps S1 to S5 in FIG. 15 are similar to Steps S1 to S5 in FIG. 8, the description thereof will be omitted.

After Step S5, the mode determination unit MD compares the measured temperature Ta with a lower-limit reference temperature (first reference temperature)=Tref×0.8 to determine whether Ta<Tref×0.8 is satisfied (Step S61). When Ta<Tref×0.8 is satisfied (YES in Step S61), the mode determination unit MD selects the idle power reduction mode and the clock generation unit CPG sets the frequency of the operation clock ck1 of the CPU to be low (Step S7). The clock generation unit CPG sets the frequency of the operation clock ck1 of the CPU to, for example, the minimum frequency at which the CPU can operate without disrupting the processing. The process then goes back to Step S4 and the mode determination is repeated.

On the other hand, when Ta<Tref×0.8 is not satisfied (NO in Step S61), the mode determination unit MD compares the measured temperature Ta with an upper-limit reference temperature (second reference temperature)=Tref×1.2 to determine whether Ta>Tref×1.2 is satisfied (Step S62). When Ta>Tref×1.2 is satisfied (YES in Step S62), the mode determination unit MD selects the leakage power reduction mode and the clock generation unit CPG sets the frequency of the operation clock ck1 of the CPU to be high (Step S8). The clock generation unit CPG sets the frequency of the operation clock ck1 of the CPU to, for example, the maximum frequency at which the CPU can operate. The process then goes back to Step S4 and the mode determination is repeated.

On the other hand, when Ta>Tref×1.2 is not satisfied (NO in Step S62), the mode determination unit MD does not select any mode and the clock generation unit CPG does not change the frequency of the operation clock ck1 of the CPU. That is, the process goes back to Step S4 and the mode determination is repeated.

Specifically, the mode determination unit MD selects the leakage power reduction mode when the measured temperature Ta exceeds the upper-limit reference temperature (Tref×1.2 in FIG. 15), and the mode determination unit MD selects the idle power reduction mode when the measured temperature Ta is below the lower-limit reference temperature (Tref×0.8 in FIG. 15). On the other hand, when the measured temperature Ta is equal to or larger than the lower-limit reference temperature and is equal to or smaller than the upper-limit reference temperature (Tref×0.8≤Ta≤Tref×1.2 in FIG. 15), no mode is selected. That is, the clock generation unit CPG does not change the operating frequency.

While the upper-limit reference temperature is Tref×1.2 and the lower-limit reference temperature is Tref×0.8 in the example in FIG. 15, the upper-limit reference temperature and the lower-limit reference temperature may be determined as appropriate. Further, while the upper-limit reference temperature and the lower-limit reference temperature are determined from the reference temperature Tref in the example in FIG. 15, they may be separately determined. As a matter of course, either one of Step S61 or Step S62 may be performed first.

FIG. 16A is a graph for describing temperature dependencies of the consumed power when the temperature of the semiconductor device according to an example of the third embodiment increases. The horizontal axis indicates the temperature [° C.], the vertical axis indicates the consumed power [mW], and the power consumed in the example is indicated by a solid line. Further, in FIG. 16A, the power consumed in the semiconductor device according to the comparative example is indicated by a dashed line (same as the comparative example shown in FIG. 12).

In FIG. 16A, in the example, the operating frequency is controlled to be decreased when the temperature is lower than the lower-limit reference temperature Tref×0.8, whereas the operating frequency is controlled to be increased when the temperature is higher than the upper-limit reference temperature Tref×1.2. As shown in FIG. 16A, when the temperature increases, the operating frequency is low when the temperature is equal to or lower than the upper-limit reference temperature, and becomes high when the temperature exceeds the upper-limit reference temperature. Accordingly, the power consumed in this embodiment is the same as that in the comparative example between the reference temperature Tref and the upper-limit reference temperature Tref×1.2. However, the power consumed in the comparative example is not so high in this temperature range, and the power consumed in this embodiment is smaller than that in the comparative example as a whole, which is substantially similar to the first embodiment.

FIG. 16B is a graph for describing temperature dependencies of the consumed power when the temperature of the semiconductor device according to the example of the third embodiment decreases. The horizontal axis indicates the temperature [° C.], the vertical axis indicates the consumed power [mW], and the power consumed in the example is indicated by a solid line. In FIG. 16B, the power consumed in the semiconductor device according to the comparative example is also indicated by a dashed line (the same as the comparative example shown in FIG. 12).

In FIG. 16B as well, in the example, the operating frequency is controlled to be decreased when the temperature is lower than the lower-limit reference temperature Tref×0.8, whereas the operating frequency is controlled to be increased when the temperature is higher than the upper-limit reference temperature Tref×1.2. As shown in FIG. 16B, when the temperature is decreased, the operating frequency is high when the temperature is equal to or higher than the lower-limit reference temperature, and becomes low when the temperature is lower than the lower-limit reference temperature. Accordingly, the power consumed in this embodiment is the same as that in the comparative example between the reference temperature Tref and the lower-limit reference temperature Tref×0.8. However, the power consumed in the comparative example is not so high in this temperature range, and the power consumed in this embodiment is smaller than that in the comparative example as a whole, which is substantially similar to the first embodiment.

As described above, in the semiconductor device according to the third embodiment, compared to the semiconductor device according to the first embodiment, the number of times that the operating frequency is switched is decreased, whereby it is possible to efficiently reduce the consumed power while making the operation of the semiconductor device stable.

<Variations>

In the foregoing, while the invention made by the inventors has been specifically explained based on the embodiments, it goes without saying that the present invention is not limited to the above-described embodiments, and that various modifications can be made within the range not departing from the gist of the present invention.

For example, besides changing the operating frequency based on the result of comparing the reference temperature Tref with the measured temperature Ta, the operating voltage may be changed as well.

REFERENCE SIGNS LIST

90 SILICON SUBSTRATE
91 GATE
92 SOURCE
92 DRAIN
93 DRAIN
94 GATE INSULATING FILM
95 SIDE WALL
96 GATE CONTACT
97 SOURCE CONTACT
98 DRAIN CONTACT
100 POWER REDUCTION MODE CONTROLLER
500 WIRELESS COMMUNICATION TERMINAL
501 HOUSING
502 DISPLAY DEVICE
503 TOUCH PANEL
504 OPERATION BUTTONS
505, 506 CAMERA DEVICES
600 WIRELESS COMMUNICATION DEVICE
601 APPLICATION PROCESSOR (HOST IC)
602 BASEBAND PROCESSOR
603 RFIC
604 MAIN MEMORY
605 BATTERY
606 PMIC
607 DISPLAY UNIT
608 CAMERA UNIT
609 OPERATION INPUT UNIT
610 AUDIO IC
611 MICROPHONE
612 SPEAKER
CM CYCLE MEASUREMENT UNIT
CMP COMPARISON UNIT
CPG CLOCK GENERATION UNIT
CPU CPU
IPU IMAGE PROCESSING UNIT
MD MODE DETERMINATION UNIT
PSC POWER SUPPLY CONTROLLER
RC REFERENCE TEMPERATURE CALCULATION UNIT
REG STORAGE UNIT
SW1-SW3 POWER SUPPLY SWITCHES
Ta MEASURED TEMPERATURE
TM TEMPERATURE MONITORING UNIT
Tref REFERENCE TEMPERATURE
TS TEMPERATURE SENSOR
VPU VOICE PROCESSING UNIT

The invention claimed is:

1. A semiconductor device comprising:
an operation unit which operates according to an operation clock;
a clock generating unit configured to generate the operation clock to be supplied to the operation unit based on a control signal, the control signal controlling an operating frequency of the operation unit;
a temperature sensor configured to measure a temperature of the semiconductor device;
a reference temperature calculating unit configured to calculate, in response to a request to calculate a reference temperature from the operation unit, a reference temperature based on an idle power and a leakage power; and
a mode determination unit configured to:
determine a power mode based on the temperature of the semiconductor device and the reference temperature, the power mode comprising one of a first mode which sets the operating frequency of the operation clock to be a first operating frequency and a second mode which sets the operating frequency of the operation clock to be a second operating frequency; and
output the control signal according to the power mode to the clock generating unit.

2. The semiconductor device according to claim 1, wherein the reference temperature calculating unit calculates the reference temperature based on a ratio of the idle power to the leakage power.

3. The semiconductor device according to claim 2, wherein the reference temperature calculating unit updates the reference temperature according to a change in the number of cycles of the operation clock when the operation unit is in an active state.

4. The semiconductor device according to claim 1, wherein the second operating frequency is greater than the first operating frequency.

5. The semiconductor device according to claim 1, wherein the mode determination unit changes the power mode from the first mode to the second mode when the temperature of the semiconductor device is greater than the reference temperature.

6. The semiconductor device according to claim 5, wherein the mode determination unit changes the power mode from the second mode to the first mode when the temperature of the semiconductor device is less than the reference temperature.

7. The semiconductor device according to claim 6, wherein a rate of a shutdown state in which a supply of a power supply voltage to the operation unit is stopped in a first mode is less than that in a second mode.

8. A method of controlling a semiconductor device having an operation unit, the method comprising:

generating an operation clock to be supplied to the operation unit based on a control signal, the control signal controlling an operating frequency of the operation unit;

measuring a temperature of the semiconductor device;

calculating, in response to a request to calculate a reference temperature from the operation unit, a reference temperature based on an idle power and a leakage power; and determining a power mode based on the temperature of the semiconductor device and the reference temperature, the power mode comprising one of a first mode which sets the operating frequency of the operation clock to be a first operating frequency and a second mode which sets the operating frequency of the operation clock to be a second operating frequency; and outputting the control signal according to the power mode to the clock generating unit.

9. The method according to claim 8, wherein the calculating of the reference temperature comprises calculating the reference temperature based on a ratio of the idle power to the leakage power.

10. The method according to claim 9, further comprising:
updating the reference temperature according to a change in the number of cycles of the operation clock when the operation unit is in an active state.

11. The method according to claim 8, wherein the second operating frequency is greater than the first operating frequency.

12. The method according to claim 8, further comprising:
changing the power mode from the first mode to the second mode when the temperature of the semiconductor device is greater than the reference temperature.

13. The method according to claim 12, further comprising:
changing the power mode from the second mode to the first mode when the temperature of the semiconductor device is less than the reference temperature.

14. The method according to claim 13, wherein a rate of a shutdown state in which a supply of a power supply voltage to the operation unit is stopped in a first mode is less than that in a second mode.

15. The semiconductor device according to claim 1, wherein the operation unit outputs a first request, and the reference temperature calculating unit calculates the reference temperature according to the first request.

16. The semiconductor device according to claim 15, further comprising:
a mode controller including the reference temperature calculating unit and the mode determination unit,
wherein the operation unit further outputs a second request and an initializing signal, and
wherein the mode controller:
acquires the measured temperature according to the second request; and
is initialized according to the initializing signal.

17. A mode controller for a semiconductor device, comprising:
a temperature sensor which measures a temperature of the semiconductor device;
a reference temperature calculating unit which calculates, in response to a request to calculate a reference temperature from an operation unit in the semiconductor device, a reference temperature based on an idle power and a leakage power; and
a mode determination unit which determines a power mode based on the measured temperature and the reference temperature, the power mode comprising one of:
a first mode which sets an operating frequency of an operation clock to be a first operating frequency; and
a second mode which sets an operating frequency of an operation clock to be a second operating frequency.

18. The mode controller of claim 17, wherein the mode determination unit outputs a control signal according to the power mode,
wherein the semiconductor device comprises:
a clock generating unit which generates the operation clock based on the control signal, and
wherein the operation unit operates at a frequency of the generated operation clock.

19. The mode controller of claim 18, wherein the operation unit outputs a first request, and the reference temperature calculating unit calculates the reference temperature according to the first request.

20. The mode controller of claim 19, wherein the operation unit further outputs a second request and an initializing signal, and
wherein the mode controller:
acquires the measured temperature according to the second request; and
is initialized according to the initializing signal.

* * * * *